US008466490B2

(12) United States Patent
Liu et al.

(10) Patent No.: US 8,466,490 B2
(45) Date of Patent: *Jun. 18, 2013

(54) ENHANCED SEGMENTED CHANNEL MOS TRANSISTOR WITH MULTI LAYER REGIONS

(75) Inventors: Tse Jae King Liu, Fremont, CA (US); Qiang Lu, Foster City, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/668,815

(22) Filed: Jan. 30, 2007

(65) Prior Publication Data

US 2007/0120156 A1 May 31, 2007

Related U.S. Application Data

(63) Continuation-in-part of application No. 11/173,237, filed on Jul. 1, 2005, now Pat. No. 7,247,887.

(51) Int. Cl.
*H01L 29/66* (2006.01)

(52) U.S. Cl.
USPC .......................................... 257/139; 438/283

(58) Field of Classification Search
USPC .......................................... 438/283; 257/139
See application file for complete search history.

(56) References Cited

U.S. PATENT DOCUMENTS

| 5,932,911 | A  | * | 8/1999  | Yue et al. ........................ 257/330 |
| 6,111,296 | A  | * | 8/2000  | Yamazaki et al. ............. 257/401 |
| 6,198,141 | B1 | * | 3/2001  | Yamazaki et al. ............. 257/404 |
| 6,355,532 | B1 | * | 3/2002  | Seliskar et al. ................ 438/283 |
| 7,247,887 | B2 | * | 7/2007  | King et al. ..................... 257/139 |
| 2004/0262700 | A1 | * | 12/2004 | Ahn et al. ....................... 257/410 |
| 2005/0023569 | A1 | * | 2/2005  | Yang ............................... 257/213 |
| 2005/0064715 | A1 | * | 3/2005  | Shaheen ........................ 438/708 |
| 2007/0122953 | A1 | * | 5/2007  | Liu et al. ........................ 438/187 |
| 2007/0128782 | A1 | * | 6/2007  | Liu et al. ........................ 438/187 |

OTHER PUBLICATIONS

Choi, Y-K. et al., "A Spacer Patterning Technology for Nanoscale CMOS," IEEE Transactions on Electron Devices, Mar. 2002, pp. 436-441, vol. 49, No. 3.
Colinge, J.P. et al., "Silicon-on-Insulator 'Gate-All-Around Device'" International Electron Devices Meeting Technical Digest, 1990, pp. 595-598.
Doyle, B.S. et al., "High Performance Fully-Depleted Tri-Gate CMOS Transistors," IEEE Electron Device Letters, Apr. 2003, pp. 263-265, vol. 24, No. 4.

(Continued)

*Primary Examiner* — Ajay K Arora
(74) *Attorney, Agent, or Firm* — Fenwick & West LLP

(57) ABSTRACT

By forming MOSFETs on a substrate having pre-existing ridges of semiconductor material (i.e., a "corrugated substrate"), the resolution limitations associated with conventional semiconductor manufacturing processes can be overcome, and high-performance, low-power transistors can be reliably produced. Ridges on the corrugated substrate can be created using high precision techniques that are not ordinarily suitable for device production. MOSFETs that subsequently incorporate the high-precision ridges into their channel regions will typically exhibit much more precise and less variable performance than similar MOSFETs formed using optical lithography-based techniques that cannot provide the same degree of patterning accuracy. Additional performance enhancement techniques such as pulse-shaped doping, "wrapped" gates, epitaxially grown conductive regions, epitaxially grown high mobility semiconductor materials, high-permittivity ridge isolation material, and narrowed base regions can be used in conjunction with the segmented channel regions to further enhance device performance.

33 Claims, 29 Drawing Sheets

OTHER PUBLICATIONS

Fossum, J. et al., "Pragmatic Design of Nanoscale Multi-Gate CMOS," IEEE International Electron Devices Meeting Technical Digest, 2004, pp. 613-616.

Jurczak, M. et al., "Silicon-on-Nothing (SON)—an Innovative Process for Advanced CMOS," IEEE Transactions on Electron Devices, Nov. 2000, pp. 2179-2187, vol. 47, No. 11.

Lee, S-Y. et al., "A Novel Sub-50nm Multi-Bridge-Channel MOSFET (MBCFET) with Extremely High Performance," Symposium on VLSI Technology Digest of Technical Papers, 2004, pp. 200-201.

Yan, R-H. et al., "Scaling the Si MOSFET: From Bulk to SOI to Bulk," IEEE Transactions on Electron Devices, Jul. 1992, pp. 1704-1710, vol. 39 No. 7.

\* cited by examiner

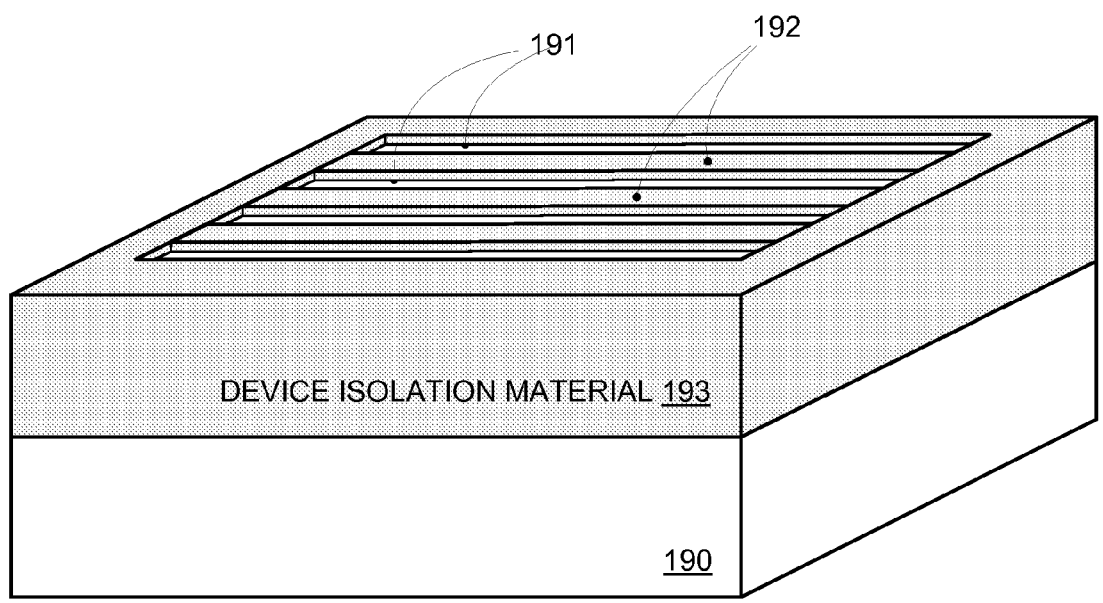
FIG. 2D2

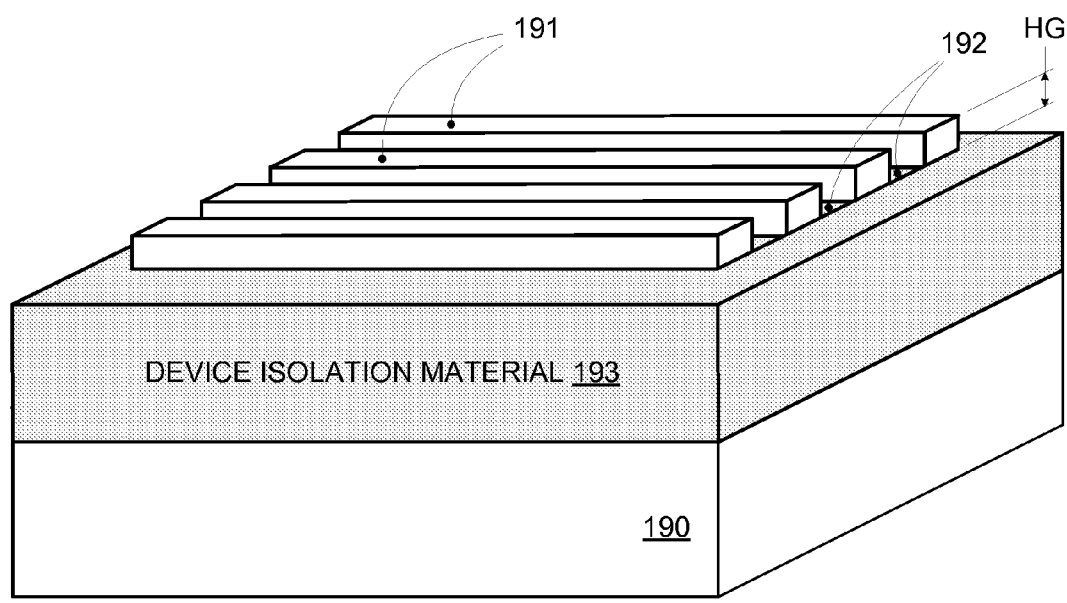
FIG. 2E2

ENHANCED SEGMENTED CHANNEL MOS TRANSISTOR WITH MULTI LAYER REGIONS

RELATED APPLICATIONS

The present application is a Continuation-In-Part of and claims the benefit of U.S. Utility patent application Ser. No. 11/173,237 by Tsu-Jae King et al., filed Jul. 1, 2005, and is incorporated herein in its entirety by reference.

BACKGROUND OF THE INVENTION

1. Field of the Invention

The invention relates to the field of semiconductor integrated-circuit devices and manufacturing, and in particular to structures for enhancing miniature transistor manufacturability and performance.

2. Related Art

Semiconductor integrated-circuit (IC) manufacturers face growing challenges to accurately and reliably produce ever-smaller transistors in order to improve the cost and performance (speed and/or functionality) of modern electronic devices. The most basic building block used in a digital IC device is the metal-oxide-semiconductor field effect transistor (MOSFET). As MOSFETs are scaled below 100 nm in minimum lateral dimension (i.e., the minimum feature size such as the gate length is less than 100 nm), size-related performance and manufacturing issues become increasingly significant.

For example, the short gate lengths in modern MOSFETs can result in relatively large source-to-drain leakage currents. Such leakage currents can cause ICs incorporating those MOSFETs to exhibit undesirably large static power consumption.
Conventional efforts to suppress source-to-drain leakage current typically involve increasing the net dopant concentration in the channel region (e.g., to a net dopant concentration greater than $10^{18}$ atoms/cm$^3$), increasing gate capacitance, and decreasing the depths of the source and drain junctions adjacent to the channel. A high net dopant concentration in the channel region serves to confine the drain-induced lateral electric field to the drain region, and thereby minimizes the effect of drain bias on the electric potential in the channel region near to the source. At the same time, by increasing the capacitive coupling between the gate electrode and the channel region (e.g., by decreasing the thickness of the gate dielectric), dominant control over the channel potential (i.e., controlling whether the transistor is on or off) is maintained by the gate electrode rather than the drain, thereby allowing the gate-induced electric field to more effectively suppress source-to-drain leakage current. By keeping the depths of the source and drain junctions adjacent to the channel shallower than the length of the channel region, sub-surface leakage currents can be suppressed.

Unfortunately, decreasing the gate dielectric thickness leads to undesirable leakage between the gate electrode and channel region. Furthermore, carrier mobility in the small channel regions of modern MOSFETS can be significantly degraded by high dopant concentration, which results in lower "on-current" for the transistor. The parasitic series resistance of the source and drain regions increases with decreasing junction depth, which also results in lower on-current for the transistor. Therefore, as steps are taken in modern MOSFET designs to reduce static power consumption (i.e., reduce source-to-drain leakage current), overall transistor performance (i.e., on-current) can suffer.

Another problem associated with smaller MOSFET dimensions relates to the sensitivity of device performance to dimensional variation. For devices formed using 90 nm technology generation (and below) processes, relatively small differences in, for example, gate length can result in significant performance differences. However, the IC manufacturing processes used to create those devices (e.g., optical lithography) are unable to provide the device-to-device dimensional consistency required to render such performance differences negligible. Consequently, circuit designers must design for worst-case scenarios to accommodate the wide range of device performance levels, thereby sacrificing overall IC performance to accommodate manufacturability concerns.

Other sources of variation in transistor performance result from geometrical irregularity. For a conventional MOSFET, sidewall gating at the edges of the active regions (due to a slightly recessed device-isolation material, typically silicon dioxide) results in threshold-voltage variation with channel width (i.e. reduction in the magnitude of the threshold voltage with decreasing channel width), because the channel is turned on at a lower gate voltage at the edges. Also, stresses in the MOSFET channel region depend on channel width as well as the device layout pattern and density, resulting in undesirable variations in transistor on-state current.

Accordingly, it is desirable to provide structures and methods that allow high-performance, low-static-power, and low-variability sub-100 nm MOSFET production.

SUMMARY OF THE INVENTION

Conventional metal-oxide-semiconductor field effect transistor (MOSFET) designs face significant challenges as they are scaled down to improve cost and/or performance with each new generation of technology used to manufacture integrated circuits (ICs). In particular, the techniques used to reduce static power consumption by minimizing source-to-drain leakage current (e.g., increased channel doping, decreased gate-dielectric thickness, and decreased source and drain junction depths) tend to also decrease transistor performance by decreasing on-current. By forming MOSFETs using a semiconductor substrate having precisely-formed and regularly-spaced stripes (ridges of semiconductor material (s)), both high performance (i.e., high on-current) and low static power consumption (i.e., low source-to-drain leakage current) can be achieved. The stripes enable the formation of segmented channel regions that accommodate a wide range of gate-electrode configuration options and also provide greater performance consistency between devices.

In some embodiments of the present invention, a MOSFET can include a segmented channel region, in which one or more dimensionally precise ridge(s) of semiconductor material (or materials) connect the source and drain regions. The ridges include a base region and a conducting region. To reduce off-state leakage current, the base region of each ridge is narrower than the conducting region. Ridge isolation material isolate the ridges. A gate electrode (and interposing gate-dielectric layer(s)) for each ridge is formed over the ridges. Heavily doped sub-surface regions within the ridges serve to further reduce source-to-drain leakage currents, thereby minimizing the static power consumption of the transistor.

In other embodiments of the present invention, a MOSFET can include a segmented channel region, in which one or more dimensionally precise ridge(s) of semiconductor material (or materials) connect the source and drain regions. The ridges include a base region and a epitaxial region that is epitaxially grown over the base region. The epitaxial region can include high-mobility semiconductor material such as silicon-germanium, germanium, gallium-arsenide, and indium-gallium-arsenide. Ridge isolation material isolate the ridges. A gate electrode (and interposing gate-dielectric layer(s)) for each ridge is formed over the ridges. Heavily doped sub-surface regions within the ridges serve to further reduce source-to-drain leakage currents, thereby minimizing the static power consumption of the transistor. For complementary MOS (CMOS) integrated circuits, a novel sequential selective epitaxial growth process used. Specifically, a first capping layer is formed on a first region. Then a first second region epitaxial layer is formed in a second region. Optionally a second second-region epitaxially layer may also be formed in the second region. Then the first capping layer is removed from the first region followed by formation of a second capping layer in the second region. Epitaxial layers can then be formed in the first region.

In still other embodiments of the present invention, a MOSFET can include a segmented channel region, in which one or more dimensionally precise ridge(s) of semiconductor material (or materials) connect the source and drain regions. The ridges include a base region and a multi-layer region. The multi-layer region can include high-mobility semiconductor material such as silicon-germanium, germanium, gallium-arsenide, and indium-gallium-arsenide. Ridge isolation material isolate the ridges. A gate electrode (and interposing gate-dielectric layer(s)) for each ridge is formed over the ridges. Heavily doped sub-surface regions within the ridges serve to further reduce source-to-drain leakage currents, thereby minimizing the static power consumption of the transistor.

Furthermore, many embodiments of the present invention may use high-permittivity dielectric material as the ridge isolation material. The high-permittivity dielectric material increases the capacitive coupling between the gate electrode and the upper portion of the ridge sidewalls. Thus, the sides of the upper portions of the ridges can become conductive under the influence of gate.

The invention will be more fully understood in view of the following description and drawings.

BRIEF DESCRIPTION OF THE DRAWINGS

FIGS. 2A, 2B, 2C, 2D, 2D2, 2E, 2E2, 2F, 2G, 2H, 2I, 2J, and 2K are steps in a manufacturing process for a transistor having a segmented channel region.

DETAILED DESCRIPTION

Conventional metal-oxide-semiconductor field effect transistor (MOSFET) designs face significant problems as those designs are scaled down to improve the cost and performance of integrated circuits (ICs). In particular, the techniques used to reduce static power consumption by minimizing source-to-drain leakage current (e.g., increased channel doping, decreased gate-dielectric thickness, decreased source and drain junction depths) tend to also decrease transistor performance by decreasing on-current. By forming MOSFETs over a substrate having precisely-formed stripes (ridges of semiconductor material(s)), both high performance (i.e., high on-current) and low static power consumption (i.e., low source-to-drain leakage current) can be achieved with good uniformity. The stripes enable the formation of segmented channel regions that accommodate a wide range of gate-electrode configuration options and also provide greater performance consistency between devices.

Figure 1A:
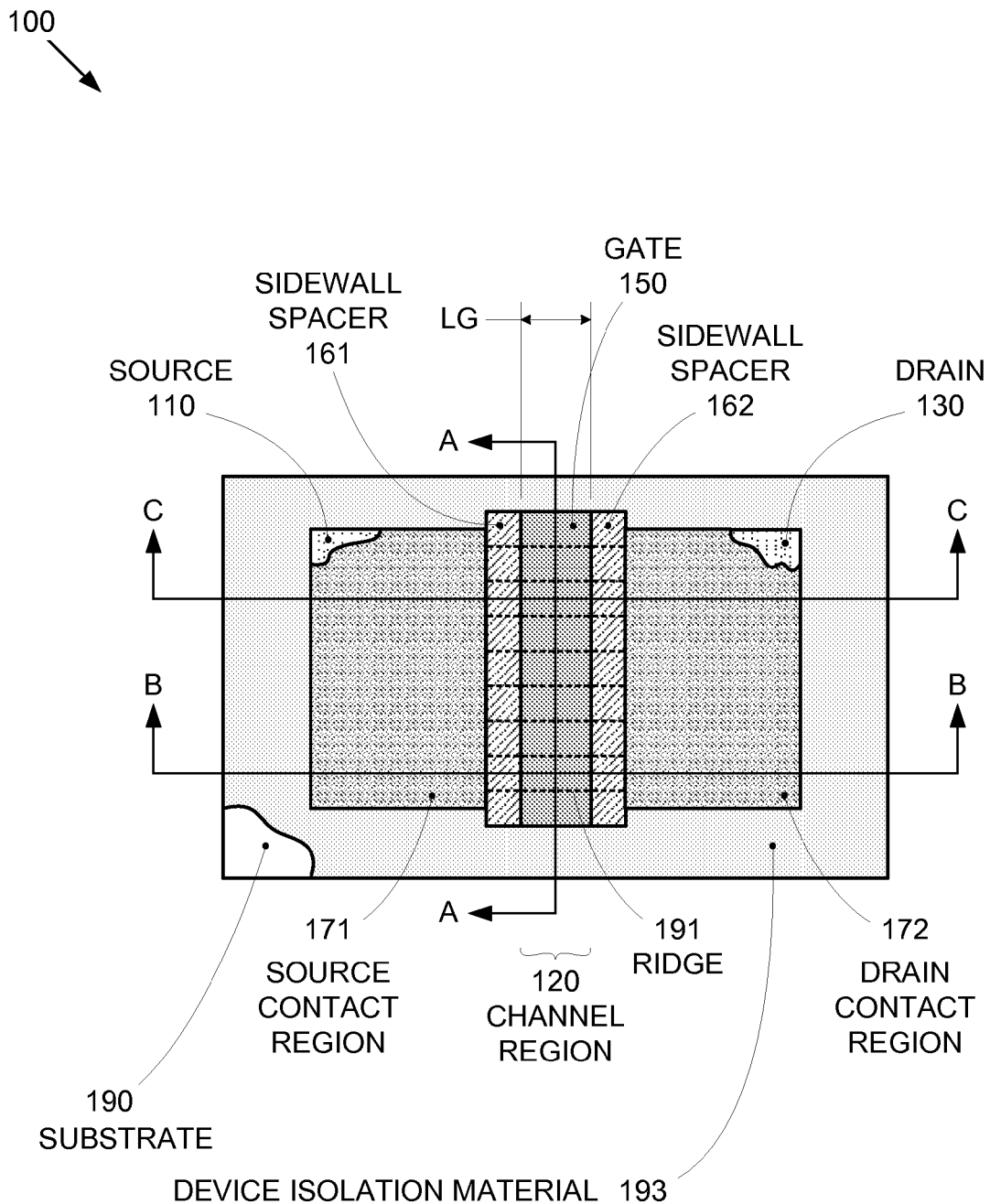
FIGS. 1A, 1B, 1C, 1D, 1E, 1F, 1G, and 1H are various views of a transistor including a segmented channel region.

FIG. 1A shows a top view of an exemplary transistor 100 that includes a segmented channel region. Transistor 100 is formed on a substrate 190 and is surrounded by device isolation material 193 (e.g., shallow trench isolation), and includes a source 110, a drain 130, a gate 150, sidewall spacers 161 and 162, a source contact region 171, and a drain contact region 172. Gate 150 (with a gate length LG) is located between source 110 and drain 130 and is formed over a channel region 120 in substrate 190. In various embodiments, gate 150 can be formed from any semiconductor/conductor material, including doped silicon, doped silicon-germanium alloy, undoped or doped silicide, undoped or doped germanosilicide, metal, metal-nitride, conductive metal-oxide, or any combination of layers of these materials, among others. Sidewall spacers 161 and 162 lie over at least a portion of source 110 and drain 130, respectively, and serve to offset the gate 150 from source contact region 171 and drain contact region 172, respectively. In various embodiments, source contact region 171 and drain contact region 172 may each be comprised in part of a metal-semiconductor compound such as silicide, germanide, or germanosilicide.

Figure 1B:
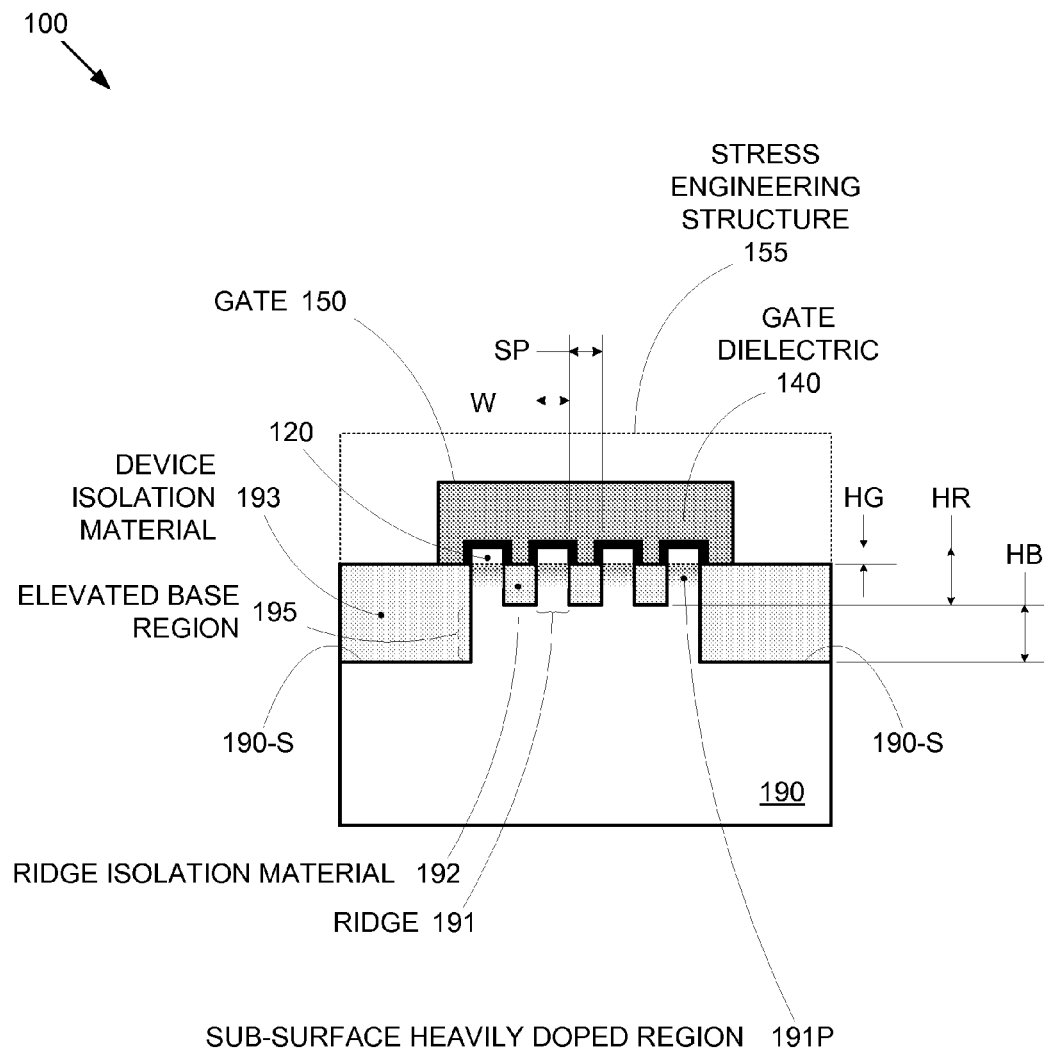

As indicated by the dotted lines, channel region 120 includes multiple ridges 191 that run between source 110 and drain 130. Ridges 191 are formed from at least one semiconductor material and may be homogenous structures (e.g., silicon, silicon-germanium alloy, germanium, silicon-carbon alloy, compound semiconductor materials, or aligned carbon nanotubes) or may have layers of different materials (e.g., a silicon layer on a dielectric layer or a silicon layer on a silicon-germanium layer). Ridges 191 are formed on an elevated base region 195 that rises from substrate 190, as shown in FIG. 1B. FIG. 1B is a cross-sectional view of transistor 100 through view location A-A (rotated 90° for clarity). Each ridge 191 has a width W, and is spaced from adjacent ridges by a spacing SP. While the spacing between adjacent ridges is depicted to be uniform in FIG. 1B for exemplary purposes, the spacing between adjacent ridges can vary. Furthermore, each ridge 191 extends a height HR above elevated base region 195, which itself rises a height HB from the adjacent surfaces 190-S of substrate 190.

Note that while four ridges 191 are depicted for exemplary purposes, transistor 100 can include any number of ridges 191, and that the particular sizing, spacing, and quantity of ridges 191 (and also of elevated base region 195) included in transistor 100 is determined in part by the desired properties of transistor 100. Note further that because ridges 191 are identified relative to substrate 190, ridges 191 continue to exist as "ridges" even covered with other materials (e.g., even though ridge isolation material 192, device isolation material 193, gate dielectrics 140, and gate 150 completely cover ridges 191, ridges 191 are still considered to be ridges.)

In addition, while depicted as homogeneous extensions of elevated base region 195 (and hence substrate 190) for exemplary purposes, ridges 191 can comprise any construction (e.g., as described in greater detail below, each of ridges 191 can include multiple layers of different semiconductor or semiconductor and dielectric materials) and may even be formed from a different material(s) than elevated base region 195 and/or substrate 190. As described in greater detail below, each of ridges 191 is a highly precise structure that therefore provides highly quantifiable performance measures. Therefore, achieving a desired performance for transistor 100 simply entails incorporating an appropriate number of ridges 191 (e.g., if each ridge provides 0.1 mA of on-current and the desired on-current for transistor 100 must be at least 0.5 mA, five ridges 191 can be included in transistor 100).

Transistor 100 is isolated from adjacent devices by device isolation material 193 (e.g., silicon dioxide, silicon nitride, or any other dielectric material(s)), which extends down to surfaces 190-S of substrate 190 (i.e., down to the bottom of elevated base region 195). Ridge isolation material 192 (which can be formed from the same material(s) or different material(s) than device isolation material 193) fills the inter-ridge regions to a distance HG below the top of ridges 191. Gate 150 is formed over the top portions of ridges 191, separated from those top portions by gate dielectric 140 (which can be formed from any dielectric material(s), including silicon dioxide, silicon oxynitride, silicon nitride, hafnium dioxide, hafnium silicate, $HfSiO_xN_y$, $Hf_{1-x}Al_xO_yN_z$, $Hf_{1-x}Al_xO_y$, zirconium dioxide, zirconium silicate, or other high-permittivity dielectric, or any combination of layers of these materials, among others). Thus, when appropriate voltages are applied to gate 150 and between source 110 and drain 130, each of ridges 191 conducts a portion of the total on-current that flows through transistor 100.

Note that gate dielectric 140 and gate 150 "wrap" around the top portions of ridges 191 (i.e., gate dielectric 140 and gate 150 extend down the sides of ridges 191 by recess distance HG). This wrapping configuration allows gate 150 to more effectively control the electric potential distribution within channel region 120, and can therefore enhance on-current while minimizing source-to-drain leakage current. Note that while gate dielectric 140 is depicted as covering only the surfaces of the top portions of ridges 191 for exemplary purposes, it can also exist over the ridge isolation material as depicted in FIG. 1J. Furthermore, in some embodiments of the present invention, the gate dielectric may include multiple layers, in which one or more of the layers lie above only the surfaces of the top portion of the ridges, while one or more other layers are continuous layers underneath the corrugated gate electrode that lie above both the ridges and the ridge isolation material. To further enhance performance, each ridge 190 can include a sub-surface heavily doped region 191P that provides a region of high dopant concentration below the top surface of each ridge (as described in greater detail below).

Note further that in various other embodiments, ridges 191 can exhibit a multilayered construction (i.e., two or more layers of different materials). For example, each ridge 191 may include a semiconductor layer formed over a dielectric layer (e.g., to reduce body leakage). Each ridge 191 may also include multiple layers of semiconductor materials (e.g., to induce a desired stress within channel region 120). In addition, transistor 100 may include any other type of stress engineering structures, as indicated by optional stress engineering structure 155 (indicated by a dotted line). For example, stress engineering structure 155 could be a stressed capping layer formed over source 110, drain 130, and gate 150 (and any intermediate structures such as sidewall spacers 161 and 162 shown in FIG. 1A) to induce a desired compressive or tensile stress within channel 120 in each ridge 191 for enhancing carrier mobility. Also, gate 150 could contain a stressed layer to induce a desired stress within channel 120 in each ridge 191 for enhancing carrier mobility.

Figure 1C:
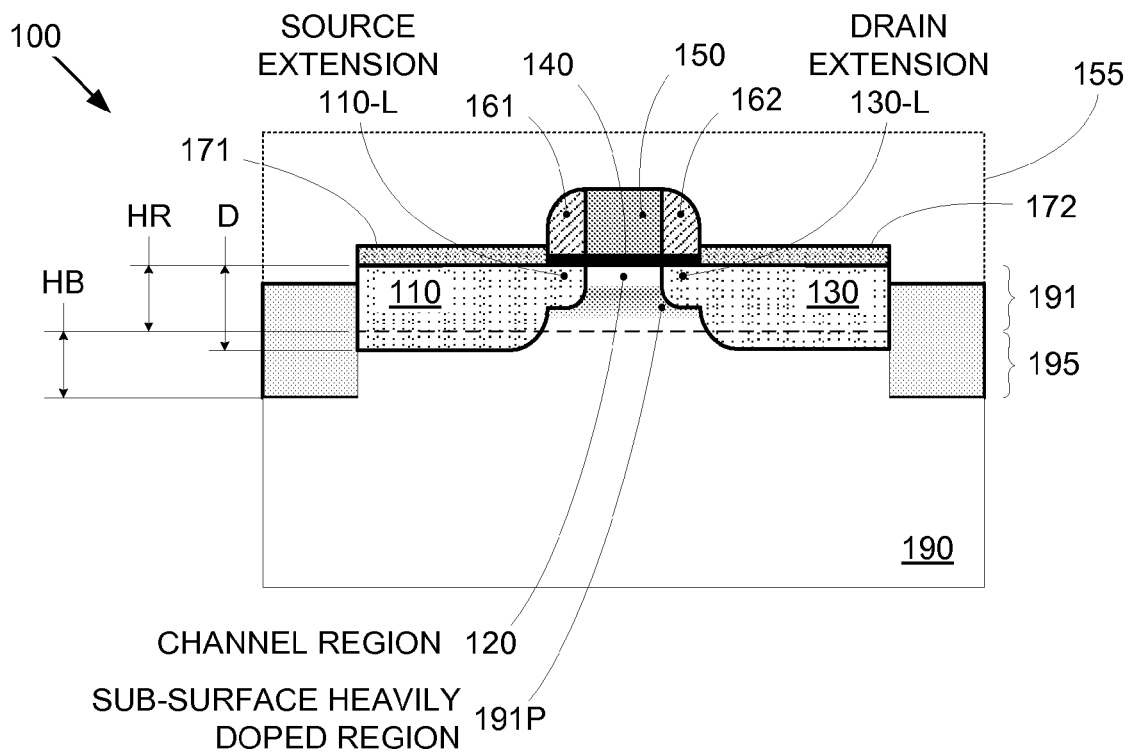

FIG. 1C shows a cross-sectional view of transistor 100 through view location B-B indicated in FIG. 1A. View location B-B provides a cross-sectional view running parallel to the direction of current flow between source 110 and drain 130 and through one of ridges 191, and therefore indicates the full doping profiles in and around channel region 120. As indicated in FIG. 1C, source 110 and drain 130 are doped regions within ridge 191. Note that source 110 and drain 130 can be formed in portions of transistor 100 that may originally have been discrete ridges (i.e., continuous with ridges 191 in channel region 120) but were subsequently filled (as described in greater detail below) to provide large planar source contact region 171 and drain contact region 172, respectively, for the landing of metallic interconnects in these regions.

Note further that source 110 and drain 130 can optionally include shallow extensions which may be more lightly doped, such as source extension 110-L and drain extension 130-L, respectively, to reduce short-channel and hot-carrier effects. Typically, source extension 110-L and drain extension 130-L are formed by performing a shallow ion implant operation after the formation of gate 150. Alternatively, they may be formed later in the transistor fabrication process as a result of silicidation or germanosilicidation. Sidewall spacers 161 and 162 are then formed on each side of gate 150, and a subsequent higher-dose, deeper implant operation is performed. Sidewall spacers 161 and 162 (which can be formed from any dielectric material(s), including silicon dioxide, silicon oxynitride, silicon nitride, hafnium dioxide, hafnium silicate, $HfSiO_xN_y$, $Hf_{1-x}Al_xO_yN_z$, $Hf_{1-x}Al_xO_y$, zirconium dioxide, zirconium silicate, or other high-permittivity dielectric, or any combination of layers of these materials, among others) block dopant penetration into the semiconductor, thereby allowing source extension 110-L and drain extension 130-L, respectively, to remain as discrete shallow extensions after this second implant operation. Note that if corrugated substrate is a silicon-on-insulator (SOI) substrate (e.g., with ridges 191 formed on an insulation layer), or if ridges 191 themselves include an insulating layer, the heavily doped regions of source 110 and drain 130 might not be deeper than source extension 110-L and drain extension 130-L, respectively.

Note further that in various other embodiments, source extension 110-L and drain extension 130-L (and/or source 110 and drain 130) may be formed at least in part from material(s) other than doped semiconductor material. For example, to reduce parasitic series resistance, source extension 110-L and drain extension 130-L (and/or some or all of source 110 and drain 130) may be formed from a metal-semiconductor compound (e.g., silicide, germanide, or germanosilicide, among others). In one embodiment, the regions of source 110 and drain 130 could be either undoped or doped prior to metal-semiconductor compound formation, so that the metal-semiconductor compound material formed in those regions may be undoped or doped, respectively.

Note also that in various other embodiments, transistor 100 may not include sidewall spacers 161 and 162 and/or source extension 110-L and drain extension 130-L. Note further that source extension 110-L and/or drain extension 130-L may or may not extend underneath the edges of gate 150. Note further that due to the enhanced gate control provided by the "wrapped" gate 150, in various other embodiments, the source and drain extensions may be eliminated, so that both source 110 and drain 130 may be implemented as singly doped regions. Note further that while depicted as extending below the bottom of ridges 191 for exemplary purposes, the depth D of source 110 and drain 130 below the surface of ridge 191 can alternatively be less than the overall height HR of ridge 191 (i.e., depth D is less than ridge height HR), so that ridge isolation material 192 (shown in FIG. 1B), which starts from the base of ridge 191, can effectively reduce the area of the junction between the source 110 and substrate 190, and the area of the junction between the drain 130 and substrate 190, thereby reducing junction leakage and capacitance.

Note further that while ridge 191 is depicted as a homogeneous structure extending from elevated base region 195 for exemplary purposes, ridge 191 can exhibit any compositional structure. As noted above with respect to FIG. 1B, ridge 191 could exhibit a multilayered structure that includes at least one layer of a semiconductor material. In other embodiments, ridge 191 could exhibit laterally changing material compositions. For example, channel region 120 (and the portion of ridge 191 below channel region 120) could exhibit different semiconductor material(s) and/or construction from the surrounding portions of ridge 191 (e.g., ridge 191 could include a dielectric region only under channel 120).

Figure 1D:
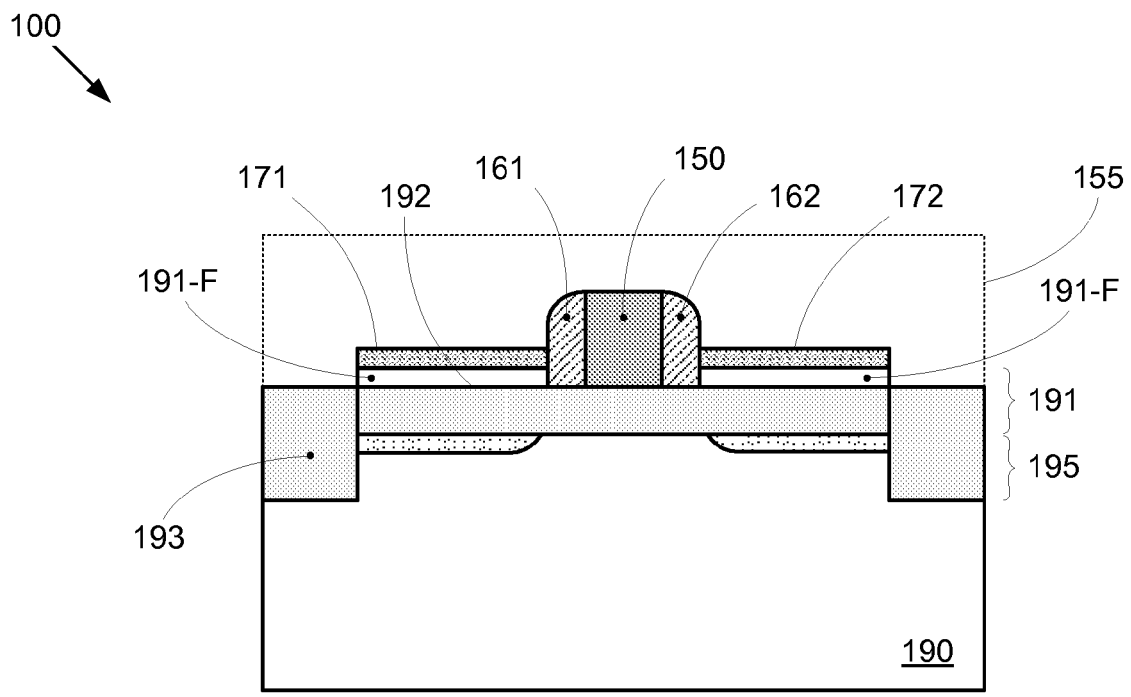

FIG. 1D shows a cross-sectional view of transistor 100 through view location C-C indicated in FIG. 1A. View location C-C runs between two ridges 191, parallel to the direction of current flow between source 110 and drain 130. Therefore, FIG. 1D depicts gate 150 (and sidewall spacers 161 and 162) extending down below the top surface of ridge 191. Specifically, gate 150 extends down to the level of ridge isolation material 192. Note that because view location C-C runs between ridges 191, the portions of source 110 and drain 130 on either side of gate 150 (and sidewall spacers 161 and 162, if present) are actually fill regions 191-F (i.e., regions formed by filling the space between the exposed portions of adjacent ridges 191, as described in greater detail below).

As noted above, the conventional method of reducing source-to-drain leakage current by increasing channel doping has the undesirable side effect of reducing channel carrier mobility, thereby reducing overall on-current. Therefore, alternative approaches have been developed to take advantage of the fact that the bulk of source-to-drain leakage current occurs in regions where the electric field induced by the gate is limited, i.e., in the portion of the channel furthest from the gate. One approach to eliminate this leakage path is to use a steep retrograde channel doping profile, such as the "pulse-shaped doping" described in "Scaling the Si MOSFET: From Bulk to SOI to Bulk", by Ran-Hong Yan et al., *IEEE Transactions On Electron Devices*, vol. 39. no. 7, JULY 1992. In the pulse-shape doping approach, a heavily doped region is formed at some distance beneath the surface of a substrate (for example, by performing a moderately high-energy ion implant operation, in which the implanted ions all penetrate to at least a desired depth below the surface). The dopant concentration profile created in this manner starts off low at the top surface of the substrate, then jumps to a high dopant concentration (the "pulse") at a desired distance below the surface, and then eventually falls back to a lower concentration. Note that in various other embodiments, the sub-surface heavy doping provided by the retrograde-doped region 191P can extend to any depth, and can even extend into the bulk substrate region of substrate 190 (i.e., below the bases of ridges 191), though it is preferable for the heavily-doped region 191P to not extend past the depth of source 110 and drain 130 in order to minimize junction capacitance and junction leakage current.

By combining appropriately positioned retrograde channel doping (as indicated by sub-surface heavily doped region 191P in FIGS. 1B and 1C) with the segmented channel construction of transistor 100, a low source-to-drain leakage current can be achieved while still providing relatively high on-current performance.

Note that the change in doping concentration provided by sub-surface heavily doped region 191P will be relatively abrupt, but will generally not be a precise step function. Instead, the dopant concentration will exhibit a relatively sharp gradient from the low dopant concentration channel region 120 to the high dopant concentration of retrograde doped region 191P. For explanatory purposes, the boundary of sub-surface heavily doped region 191P (i.e., the bottom of undoped or lightly doped channel region 120) can be considered to be the location at which the dopant concentration reaches 50% of the maximum dopant concentration in sub-surface heavily doped region 191P.

As depicted in FIG. 1B, heavily doped regions 191P are ideally located such that the undoped or lightly doped channel region 120 in each ridge 191 corresponds to the overlap R between gate 150 and each ridge 191. In other words, the sub-surface heavily doped region 191P preferably starts at the point where gate 150 ends along each ridge 191 (i.e., at distance HG below the top surface of ridge 191). This design can provide an optimal trade-off between transistor performance and power consumption, since the channel region 120 in each ridge 191 is bounded on three sides by gate 150 to maximize gate control to achieve high on-current, and is bounded by sub-surface heavily doped region 191P just below gate 150 to minimize source-to-drain leakage current. Note, however, that the dopant concentration profile of the sub-surface heavily doped region 191P will typically not be a sharp step function (i.e., the dopant concentration will not abruptly jump to the maximum dopant concentration level). The actual dopant concentration profile of sub-surface heavily doped region 191P will be a roughly exponential or Gaussian increase (until the maximum dopant concentration is reached). Therefore, benefits provided by sub-surface heavily doped region 191P can generally be maximized if the distance from the top surface of ridge 191 at which sub-surface heavily doped region 191P reaches 50% of the maximum dopant concentration is equal to or less than distance HG. Note that the boundary of sub-surface heavily doped region 191P generally should not be located too close to (e.g., less than 5 nm away from) the top surface of ridge 191, however, otherwise the transistor on-state drive current will be degraded. Thus, if distance HG is very small (e.g., less than 5 nm), then sub-surface heavily doped region 191P should start below the point where gate 150 ends along each ridge 191.

Figure 1E:
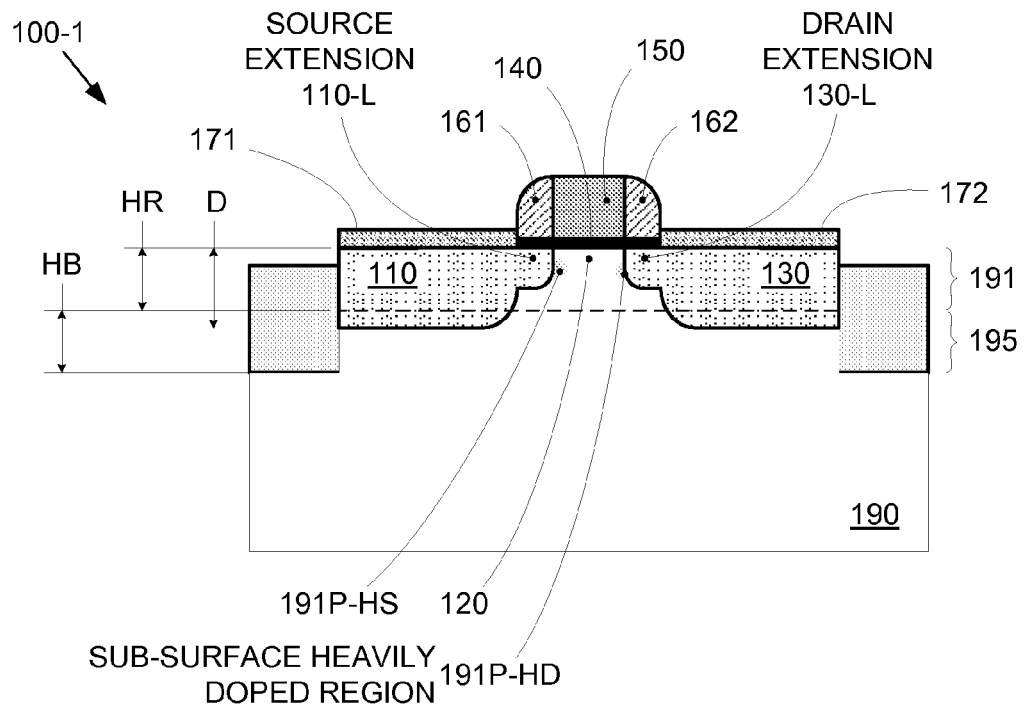
Figure 1F:
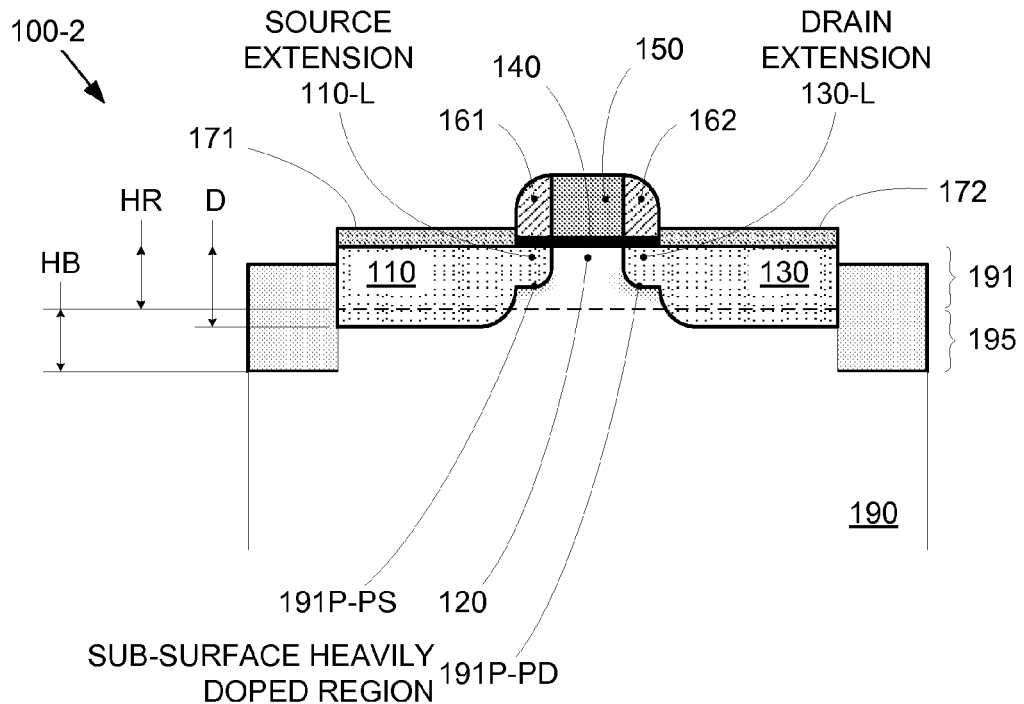

Note that any other techniques for creating sub-surface heavily doped regions can be used. For example, FIG. 1E shows a cross-sectional view of a transistor 100-1 that is substantially similar to transistor 100 described with respect to FIGS. 1A-1D, except that rather than incorporating a retrograde channel doping profile (191P), transistor 100-1 includes sub-surface heavily doped regions 191P-HS and 191P-HD. Sub-surface heavily doped regions 191P-HS and 191P-HD are formed using "halo" doping adjacent to source extension 110-L and drain extension 130-L, respectively. By creating a high channel dopant concentration near to the source and drain extensions, this halo doping can reduce short channel effects, thereby minimizing source-to-drain leakage current. FIG. 1F shows a cross-sectional view of a transistor 100-2 that is substantially similar to transistor 100-1 shown in FIG. 1E, except transistor 100-2 includes sub-surface heavily doped regions 191P-PS and 191P-PD beneath source extension 110-L and drain extension 130-L, respectively. These "pocket" doped regions can provide the same type of leakage current reduction described with respect to sub-surface heavily doped regions 191P-HS and 191P-HD described with respect to FIG. 1E.

Table 1 shows sample data obtained via three-dimensional process and device simulations for comparing the performance (on-state drive current and off-state source-to-drain leakage current, each normalized to the transistor layout width) of various n-channel implementations of transistor 100 (rows 1, 2, 3, and 4) against the transistor performance specifications as published in the International Technology Roadmap for Semiconductors (ITRS), 2005 Edition (rows 5 and 6). Each of the implementations of transistor 100 is based on a fundamental set of implementation values, including a single ridge 191 in the channel region, 45 nm gate length LG, 90 nm ridge pitch (i.e., the total layout width of the simulated transistor 100 is 90 nm), a thickness for gate dielectric 140 equivalent to 1.7 nm of $SiO_2$, and a gate work function of 4.7 V. The depths of the sub-surface heavily doped region 191P, source extension 110-L, and drain extension 130-L each correspond to the overlap R between gate 150 and each ridge 191. The power supply voltage is 1 V, and no stress-based mobility enhancement is assumed.

TABLE 1

| No. | Description | W (nm) | LG (nm) | HG (nm) | $I_{on}$ (mA/µm) | $I_{off}$ (nA/µm) |
|---|---|---|---|---|---|---|
| 1 | Slightly Recessed Vbs = 0 V | 45 | 45 | 20 | 0.309 | $2 \times 10^{-5}$ |
| 2 | Moderately Recessed Vbs = 0 V | 45 | 45 | 30 | 0.531 | $1.3 \times 10^{-3}$ |
| 3 | Very Recessed Vbs = 0 V | 45 | 45 | 40 | 0.676 | 0.05 |
| 4 | "FinFET-like" Vbs = 0 V | 30 | 45 | 40 | 0.574 | 0.01 |
| 5 | ITRS Low Operating Power | NA | 45 | NA | 0.589 | 0.3 |
| 6 | ITRS Low Standby Power | NA | 45 | NA | 0.52 | 0.01 |
| 2B | Moderately Recessed Vbs = 0.4 V | 45 | 45 | 30 | 0.593 | 0.03 |
| 3B | Very Recessed Vbs = 0.4 V | 45 | 45 | 40 | 0.722 | 0.5 |
| 4B | "FinFET-like" Vbs = 0.4 V | 30 | 45 | 40 | 0.596 | 0.09 |

As indicated in Table 1, design number 1, which incorporates a ridge width of 45 nm and a recess distance of 20 nm ("Slightly Recessed"), provides an on-state drive current $I_{on}$ of 0.309 mA/µm and an off-state source-to-drain leakage current $I_{off}$ of $2\times10^{-5}$ nA/µm. Note that $I_{on}$ and $I_{off}$ are listed in terms of current per micron layout width (in the direction transverse to the direction of current flow) to normalize the current values. Thus, by implementing transistor 100 with just a slight wrapping of gate 150 around ridge 191, a very low off-state leakage current is achieved, but the on-state drive current is somewhat low. Increasing the recess distance HG to 30 nm in design number 2 provides an increase in $I_{on}$ to 0.531 mA/µm, at the trade-off of increasing $I_{off}$ to $1.3\times10^{-3}$ nA/µm. Further increasing recess distance HG to 40 nm in design number 3 provides an increase in $I_{on}$ to 0.676 mA/µm, at the trade-off of increasing $I_{off}$ to $5\times10^{-2}$ nA/µm. Thus, implementing transistor 100 using values similar to design number 3 would generally be best for low operating power (LOP) circuits, whereas implementing transistor 100 using values similar to design number 1 would be best for low standby power (LSTP) circuits.

As indicated by the performance values provided for design numbers 1 through 3, transistor 100 allows the relationship between on-current $I_{on}$ and off-current $I_{off}$ to be adjusted via recess distance HG, i.e. the depth of the sub-surface heavily doped region 191P. In contrast, the $I_{on}/I_{off}$ relationship in conventional transistors is typically modified by adjusting the doping concentration within the channel region to achieve a particular threshold voltage. Because dimensional control (i.e., control over recess distance HG and the location of sub-surface heavily doped region 191P) can be more precise than dopant concentration control (i.e., control over the number of dopant atoms in the channel region), transistor 100 can significantly ease the difficulties associated with achieving a particular combination of on-current $I_{on}$ and off-current $I_{off}$.

Adjusting other parameters of transistor 100, such as decreasing gate length LG or decreasing ridge width W can provide additional adjustment control over on-current $I_{on}$ and off-current $I_{off}$. Design number 4 ("FinFET-like") approximates a vertical transistor design that has been developed in an effort to overcome the aforementioned limitations of conventional MOSFET transistors. A FinFET incorporates a high aspect ratio structure (fin) extending above the substrate surface that forms the channel region for the transistor. A gate is formed transverse to the fin and down both sides of the fin, thereby providing a "double gate" type of structure (i.e., the gate electrode induces an electric field from both sides of the fin in the channel region). As indicated by the values for design number 4, the FinFET can achieve lower off-current $I_{off}$. However, its on-state drive current $I_{on}$ is also lower because of reduced layout efficiency. (The top surface of ridge 191 does not contribute significantly to $I_{on}$ if the stripe width is narrow, as detailed in the publication "Pragmatic design of nanoscale multi-gate CMOS", by J. Fossum et al., *IEEE International Electron Devices Meeting Technical Digest*, pp. 613-616, 2004.) Also, the high aspect ratio fin coupled with a deep recess distance (essentially the full height of the fin channel region) can make the FinFET substantially more difficult to manufacture than transistor 100 (which can be formed using standard manufacturing processes as described in greater detail below).

Transistor 100 therefore provides a highly manufacturable structural design that still allows a great deal of performance enhancement and power savings capabilities. A significant advantage of the segmented channel MOSFET design is that it provides for minimal variation in threshold voltage. This is because the width of each ridge 191 is the same, so that the threshold voltage of each channel segment, and hence every transistor, is the same.

Note that the raised construction of ridges 191 can also beneficially minimize stress induced within the channel region of transistor 100 by the insulation material surrounding the device. Material stress can significantly affect the performance of a transistor (both negatively and positively). Therefore, it is desirable to be able to accurately define the stress within the channel region of a transistor. Due to the raised nature of ridges 191, any undesirable transverse stress at the base of ridges 191 will typically be significantly reduced within the top portions of ridges 191 wherein the active region of transistor 100 resides (i.e., from the tips of ridges 191 down to a distance HG). Furthermore, stress within transistor 100 is reduced even more by the fact that ridges 191 are formed on elevated base region 195 that further removes channel region 120 from the regions of highest stress (where device isolation material 193 meets elevated base region 195). Therefore, the elevated, ridged construction of transistor 100 can significantly reduce undesirable stress within transistor 100 as well as variation in stress due to variations in channel width, device layout pattern, and device density (versus conventional transistor designs). In general, beneficial stress relief from and adequate electrical isolation by device isolation material 193 can be provided when the depth of device isolation material 193 below the base of ridges 191 is at least equal to the height of ridges 191 (i.e., elevated base height HB is greater than or equal to ridge height HR). However, optimal stress/electrical isolation may be provided by significantly higher base height/ridge height ratios (e.g., base height HB is equal to 5× ridge height HR). Note also that since ridges 191 can be defined and manufactured with a high degree of precision (as described in greater detail below), beneficial stress within each ridge 191 can be accurately induced (e.g., by forming ridges 191 as silicon on silicon-germanium stacks) to allow transistor 100 to achieve a desired performance simply by incorporating an appropriate number of ridges 191.

Thus, the segmented channel MOSFET design is more robust to process-induced and design-induced variations, compared to a conventional MOSFET.

A major advantage of the segmented channel MOSFET over the FinFET structure is that body biasing techniques can be used to tune the threshold voltage and therefore $I_{on}$ vs. $I_{off}$. (Refer to design numbers 2B and 3B in Table 1.) Specifically, body biasing is effective for tuning threshold voltage only if a major portion of the channel region is in close proximity to the biased body region. For a FinFET implemented on a bulk-silicon substrate, the majority of the channel region is too far from the biased body region to be strongly affected by body biasing. Note that the relative changes in $I_{on}$ and $I_{off}$ achieved with body biasing for the "FinFET-like" structure (design number 4B in Table 1) are smaller than for the "Slightly Recessed" and "Moderately Recessed" structures (design numbers 2B and 3B in Table 1). For a FinFET implemented on an SOI substrate, there is no body contact, hence body biasing is not possible. This is also the case for the tri-gate FET (described in the publication "High performance fully-depleted tri-gate CMOS transistors" by B. S. Doyle et al., IEEE Electron Device Letters, vol. 24, pp. 263-265, 2003). However, in transistors in accordance with the present invention, the channel region is near enough to the biased body region (i.e. the sub-surface heavily doped region 191P) to be affected by body biasing. In general, forward body biasing reduces the magnitude of the threshold voltage while reverse body biasing increases the magnitude of the threshold voltage. N-channel transistors are forward body biased with a body-to-source voltage (Vbs) greater than 0 Volts and reverse body biased with a body-to-source voltage (Vbs) less than 0 Volts. P-channel transistors are forward body biased with a body-to-source voltage (Vbs) less than 0 Volts and reverse body biased with a body-to-source voltage (Vbs) greater than 0. In some embodiments of the present invention, reverse body biasing is used to raise the magnitude of the threshold voltage of transistors with doped silicon gates. In other embodiments of the present invention, forward body biasing is used to reduce the magnitude of the threshold voltage of transistors with metal gates.

Figure 1G:
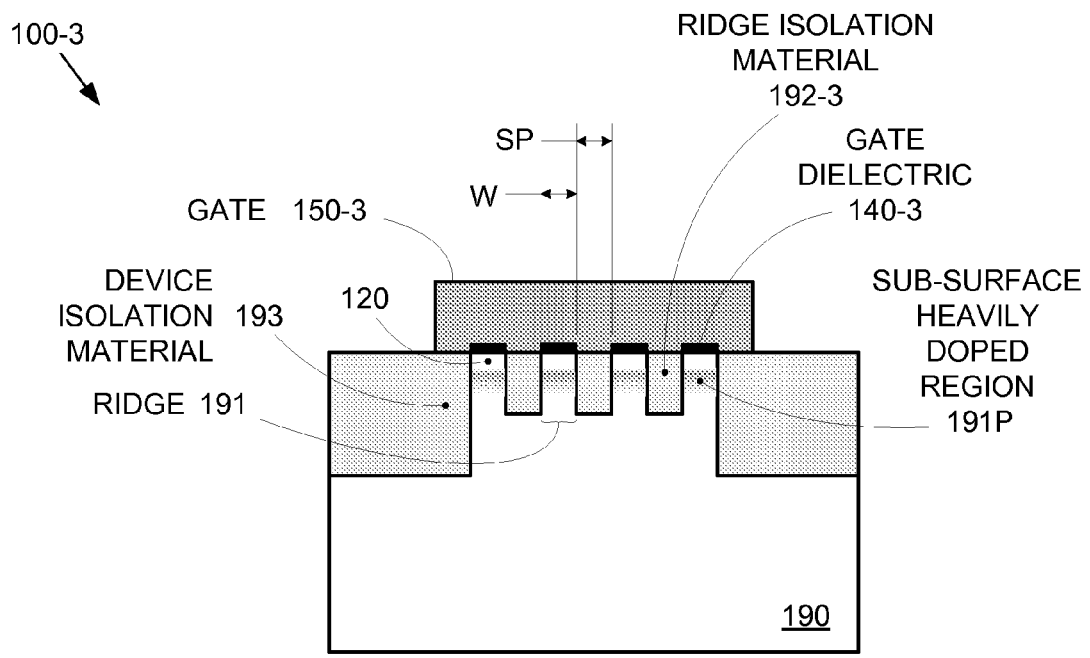

Note further that almost any enhancements available to conventional MOSFET designs can be applied to transistor 100. For example, in one embodiment, the gate of transistor 100 may simply be flush with the top surfaces of ridges 191 (i.e., distance HG shown in FIG. 1B is zero). FIG. 1G shows an alternative cross-sectional view of transistor 100 (labeled as transistor 100-3 for clarity) through view location A-A indicated in FIG. 1A. The cross-sectional view of transistor 100-3 is substantially similar to the cross-sectional view of transistor 100 shown in FIG. 1B, except that in transistor 100-3, ridge isolation material 192-3 extends all the way up the sides of ridges 191, and gate 150-3 (and gate dielectrics 140-3) does not wrap around the top portions of ridges 191. The sub-surface heavy doping provided by the heavily-doped region 191P begins at some depth below the top surface of ridges 191, and can extend to any depth, though it is preferable for the heavily-doped region 191P to not extend past the depth of source 110 and drain 130 in order to minimize junction capacitance and junction leakage current.

Figure 1H:
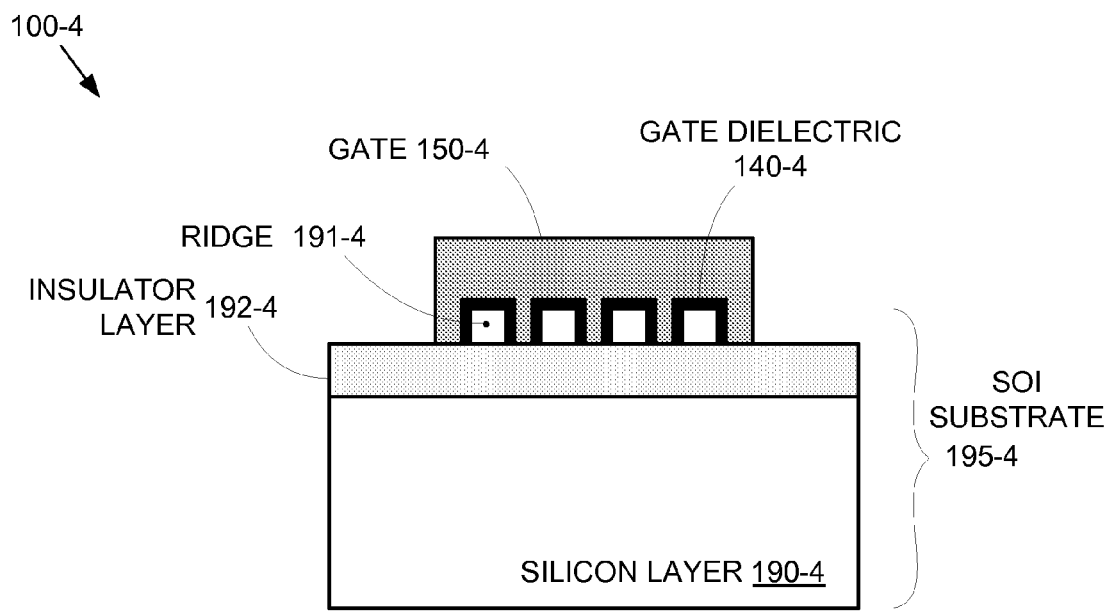

In another embodiment, the segmented channel construction of transistor 100 can be incorporated into a device formed on an SOI substrate. FIG. 1H shows another alternative cross-sectional view of transistor 100 (labeled as transistor 100-4 for clarity) through view location A-A indicated in FIG. 1A. Transistor 100-4 includes ridges 191-4 formed on the insulator layer 192-4 of an SOI substrate 195-4. Gate dielectrics 140-4 are formed over each of ridges 191-4, over which gate 150-4 is formed. Note that transistor 100-4 does not require the ridge isolation material 192 or the device isolation material 193 shown in FIG. 1B, because insulator layer 192-4 provides the same electrical isolation. Note further that depending on the height of ridges 191-4, pulse-shaped doping may or may not be necessary to reduce source-to-drain leakage for transistor 100-4, due to the channel-bounding effect of insulator layer 192-4.

FIGS. 1I-1M provide detailed images of ridges in accordance to various embodiments of the present invention. Because much of the basic ridge structure is similar to the ridges described above, only the differences in each ridge are described in detail. Furthermore, the distinctive features illustrated individually in each Figure can be combined into further embodiments that are within the scope of the present invention.

Figure 1I:
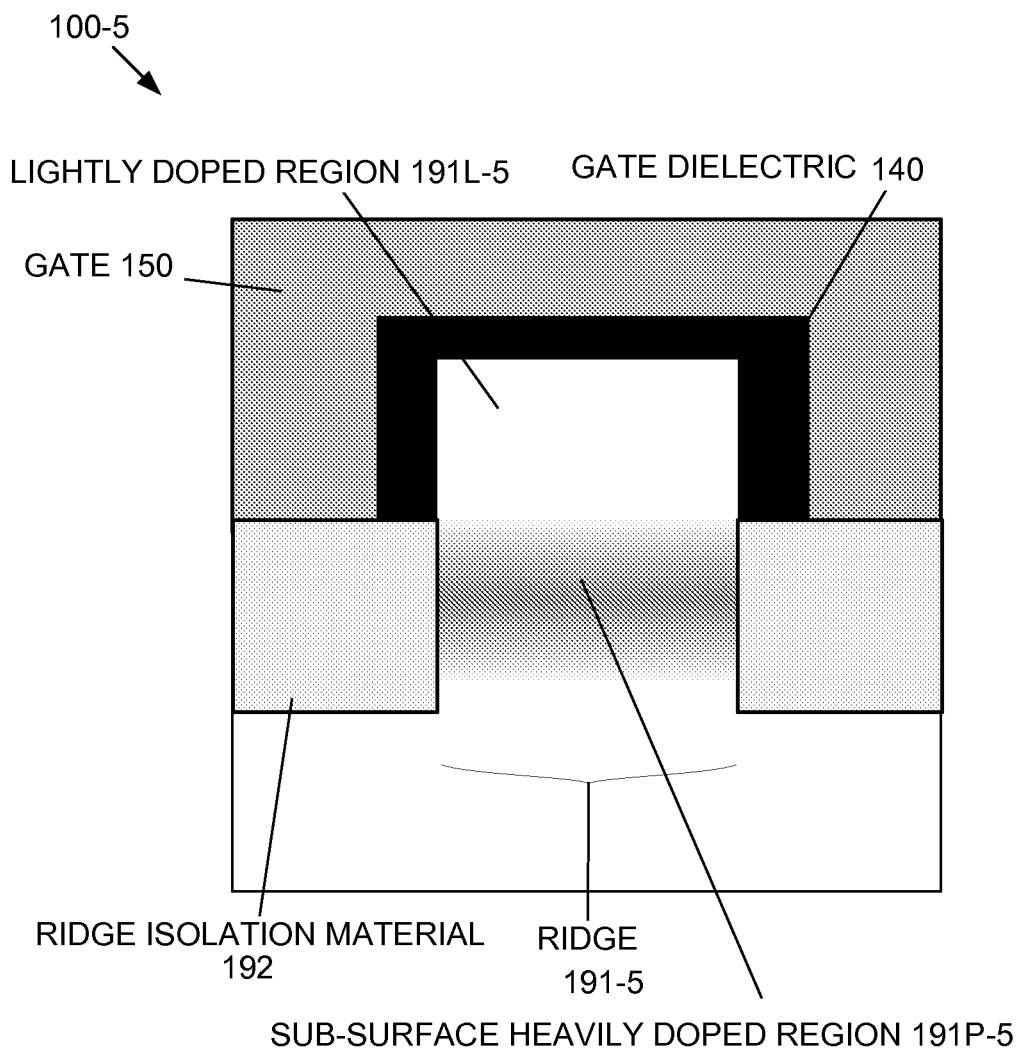
FIGS. 1I, 1J, 1K, 1L, 1M are detailed views of portions of transistors include a segmented channel region.
Figure 1J:
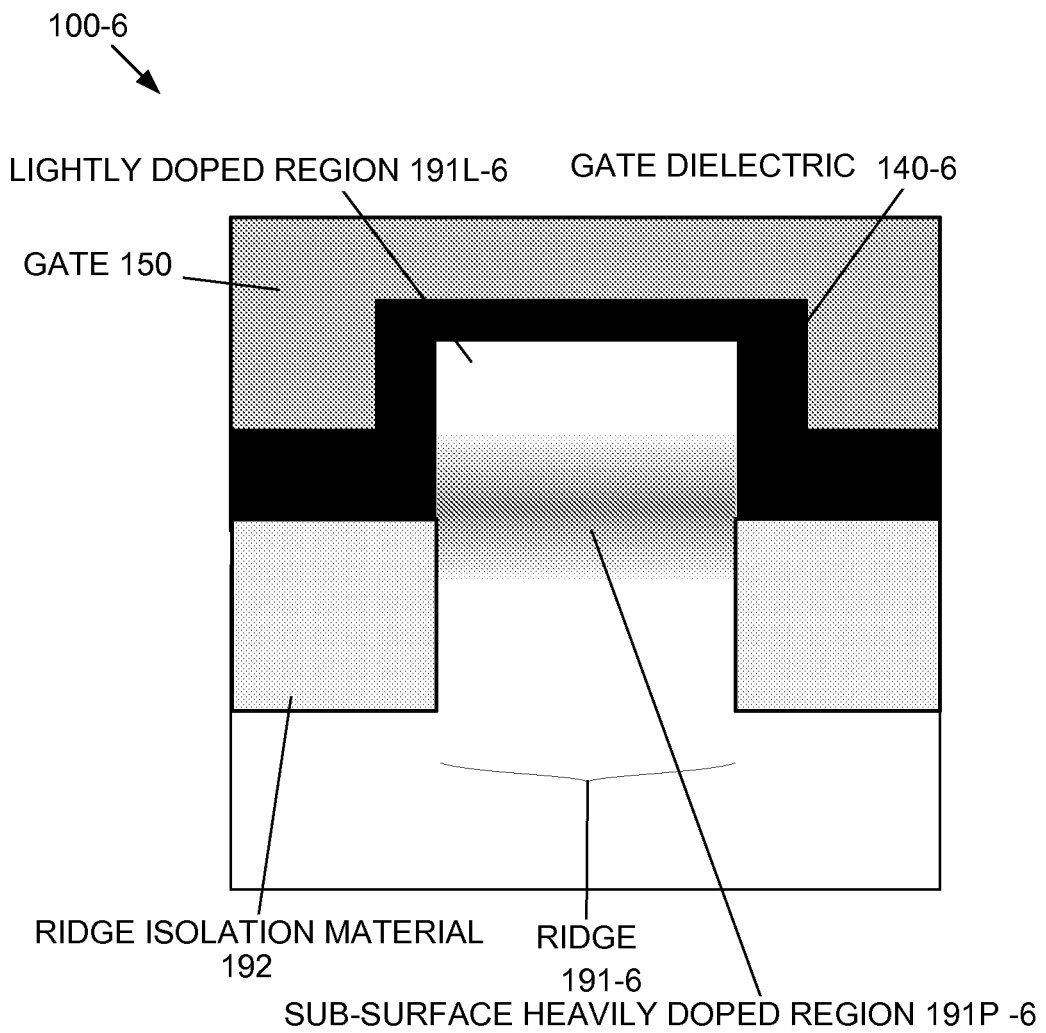

FIG. 1I shows the region around a ridge 191-5 of a transistor 100-5. The other ridges in transistor 100-5 are substantially similar to the illustrated ridge. Epitaxial growth is used in the formation of the ridges in transistor 100-5. Specifically, lightly doped region 191L-5 of the ridges of transistor 100-5 is an epitaxially grown layer on top of sub-surface heavily doped region 191P-5. To prevent dopant migration from sub-surface heavily doped region 191H-5, lightly doped region 191L-5 should be epitaxially grown at a low temperature (less than 900° C.). Lightly doped region 191L-5 should have a doping concentration less than $1E18$ $cm^{-3}$. In some embodiments the sub-surface heavily doped region 191P-5 is also formed using epitaxial growth. However, in other embodiments sub-surface heavily doped region 191P-5 is formed using ion implantation. Sub-surface heavily doped region 191P-5 should have a dopant concentration greater than $3E18$ $cm^{-3}$. The exact process steps used to form transistor 100-5 are described in more detail below.

FIG. 1J shows a region around a ridge 191-6 of a transistor 100-6. Portions of the ridges of transistor 100-6 are epitaxially grown, like for transistor 100-5. Specifically, both lightly doped region 191L-6 and sub-surface heavily doped region 191P-6 are epitaxially grown. However, in the specific process for transistor 100-6, sub-surface heavily doped region 191P-6 rises above ridge isolation material 192. As explained above, the sub-surface heavily doped region should ideally be located just below gate 150. Thus, for transistor 100-6, gate dielectric 140-6 is formed over ridge isolation material 192 as well as lightly doped region 191L-6 so that a substantial portion of the sub surface heavily doped region 191P-6 is below gate 150. In some embodiments of the present invention, a separate step is used to place a dielectric on ridge isolation material 192 rather than during formation of the gate dielectric. In general, lightly doped region 191L-6 should have a doping concentration less than 1E18 $cm^{-3}$ and sub-surface heavily doped region 191P-6 should have a dopant concentration greater than 3E18 $cm^{-3}$.

Figure 1K:
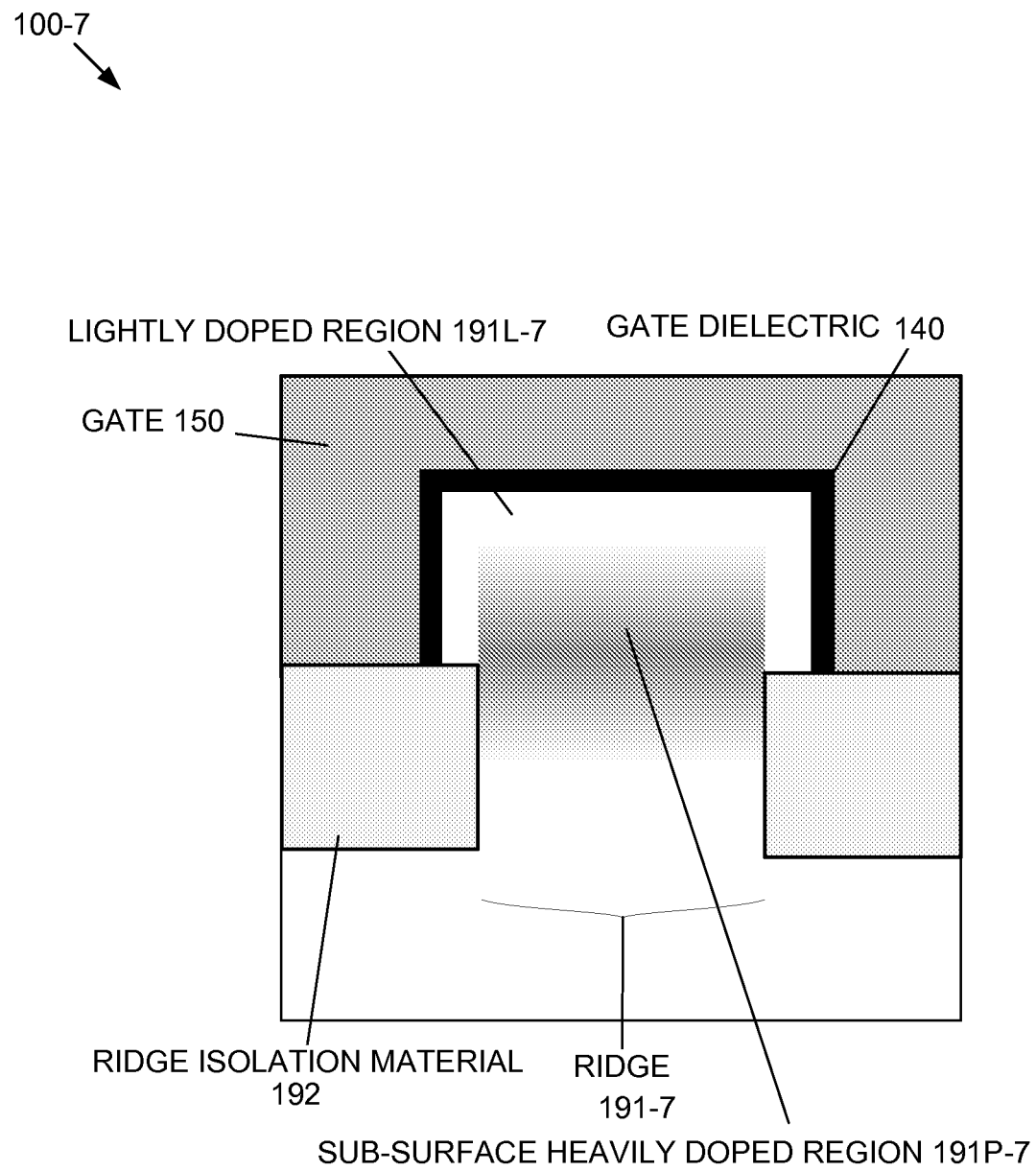

FIG. 1K shows a region around a ridge 191-7 of a transistor 100-7. Portions of the ridges of transistor 100-7 are epitaxially grown, like for transistor 100-6. Specifically, both lightly doped region 191L-7 and sub-surface heavily doped region 191P-7 are epitaxially grown. In the specific process for transistor 100-7, sub-surface heavily doped region 191P-7 rises above ridge isolation material 192. Furthermore, lightly doped region 191L-7 is epitaxially grown on the top and sides of the portion of sub-surface heavily doped region 191P-7 rising above ridge isolation material 192. Thus, lightly doped region 191L-7 wraps around the portion of sub-surface heavily doped region 191P-7 rising above ridge isolation material 192. Gate dielectric 140 and gate 150 in turn each wrap around lightly doped region 191L-7 and can induce current flow along the top surface and side surfaces of lightly doped region 191L-7. In general, lightly doped region 191L-7 should have a doping concentration less than 1E18 $cm^{-3}$ and sub-surface heavily doped region 191P-7 should have a dopant concentration greater than 3E18 $cm^{-3}$.

Figure 1L:
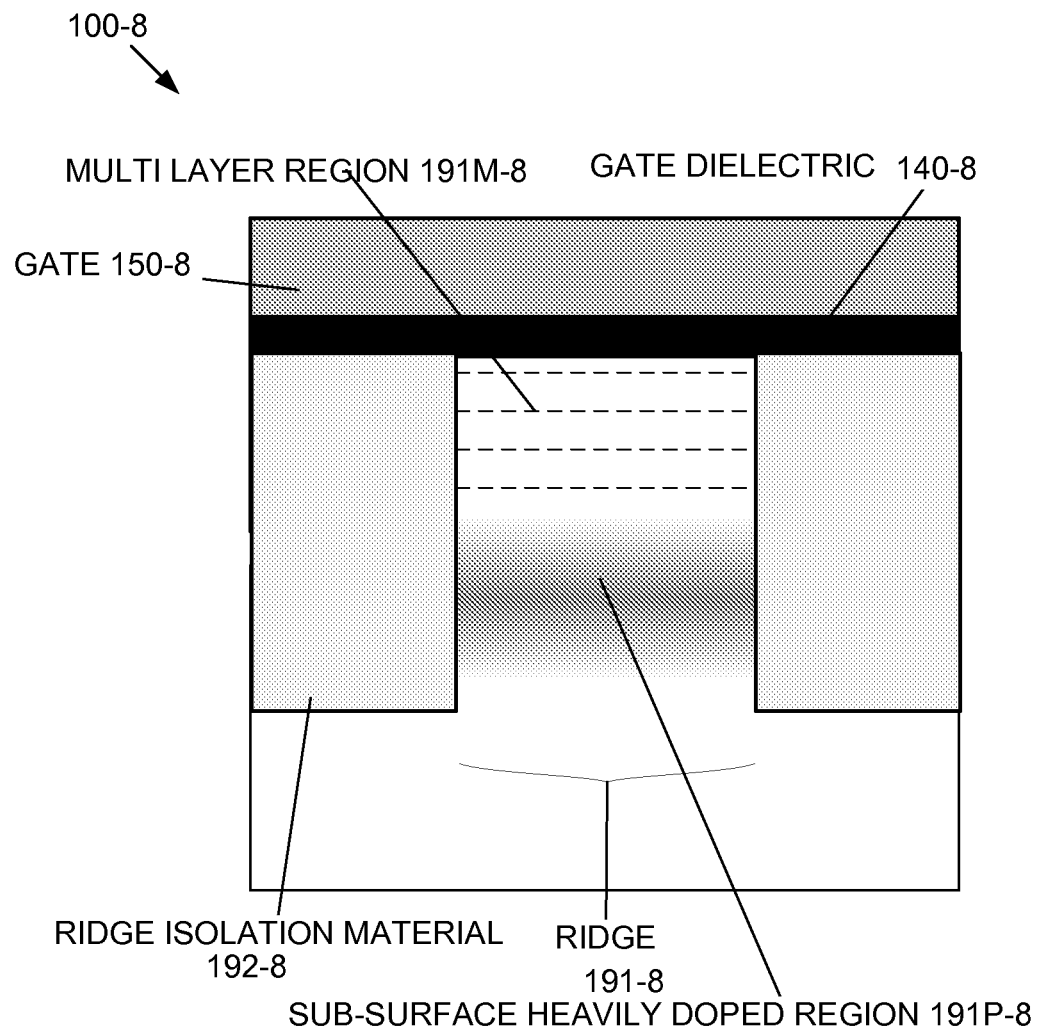

As mentioned above, ridges in accordance with the present invention may be formed from multiple layers of different materials. FIG. 1L illustrates one embodiment of the present invention in which ridges include a multi-layer region. Specifically, FIG. 1L shows a region around a ridge 191-8 of a transistor 100-8. Transistor 100-8 is illustrated using a gate structure similar to the embodiment of FIG. 1G. Specifically, in transistor 100-8 ridge isolation material 192-8 extends to the top of ridge 191-8. Thus, gate dielectric 140-8 and gate 150-8 do not wrap around the top of the ridges. However, the ridge structure illustrated in FIG. 1L could be used with wrap around gates (i.e. similar to the gate structure in the embodiment of FIG. 1B) as well. Ridge 191-8 includes a multi-layer region 191M-8 over a sub-surface heavily doped region 191P-8. Sub-surface heavily doped region 191P-8 can be epitaxially grown or formed by dopant implantation as described above. Multi-layer region 191M-8 is formed layer by layer on top of sub-surface heavily doped region 191P-8. Most of the layers in multi-layer region 191M-8 are epitaxially grown. Furthermore, any of the layers may be doped by incorporating dopants in situ during growth or by dopant implantation. In general, the layer(s) within multi-layer region 191M-8 in which current flows in the on state should have a doping concentration less than 1E18 $cm^{-3}$ and sub-surface heavily doped region 191P-8 should have a dopant concentration greater than 3E18 $cm^{-3}$.

In one embodiment of the present invention, multi-layer region 191M-8 includes a silicon-germanium layer with an optional thin silicon interfacial layer on top. The silicon-germanium layer can be either strained or unstrained. The thin silicon interfacial layer on top (generally with a thickness less than or equal to 5 nm) is used to provide a better interface with gate dielectric 140-8 than would be achieved with silicon-germanium. In another embodiment of the present invention, multiple layers of silicon-germanium are epitaxially grown. Each successive silicon-germanium layer has increasingly greater concentration of germanium. An optional thin silicon interracial layer on top may be included to provide a better interface with gate dielectric 140-8. Furthermore, some embodiments of the present invention may include a thin buffer layer of undoped silicon between the silicon germanium layer(s) and sub-surface heavily doped region 191P-8 to provide a more uniform surface for the formation of the silicon-germanium layer(s).

In another embodiment of the present invention, multi-layer region 191M-8 includes a germanium layer with an optional thin silicon interfacial layer on top. The germanium layer can be either strained or unstrained. The thin silicon interfacial layer (generally with a thickness less than or equal to 5 nm) is used to provide a better interface with gate dielectric 140-8 than would be achieved with germanium. In another embodiment of the present invention, a silicon-germanium buffer layer is formed prior to the formation of the germanium layer. Alternatively, multiple layers of silicon-germanium (with increasing concentrations of germanium) could be formed prior to formation of the germanium layer.

In another embodiment of the present invention, multi-layer region 191M-8 includes a gallium-arsenide layer, which can be strained or unstrained. A germanium buffer layer may be formed prior to the formation of the gallium-arsenide layer to facilitate the formation of the gallium-arsenide layer. Furthermore, an optional silicon-germanium buffer layer (or multiple silicon-germanium layers as described above) may be formed prior to the formation of the germanium layer. In addition, a thin interfacial layer of aluminum-gallium-arsenide may be formed on top of the gallium-arsenide layer to provide a better interface with gate dielectric 140-8.

In another embodiment o the present invention, multi-layer region 191M-8 includes an indium-gallium-arsenide layer, which can be strained or unstrained. A gallium-arsenide buffer layer is formed prior to the formation of the indium-gallium-arsenide layer. A germanium buffer layer may be formed prior to the formation of the gallium-arsenide buffer layer to facilitate the formation of the gallium-arsenide buffer layer. Furthermore, an optional silicon-germanium buffer layer (or multiple silicon-germanium layers as described above) may be formed prior to the formation of the germanium buffer layer. For unstrained indium-gallium-arsenide, an indium-aluminum-arsenide layer is formed on the gallium-arsenide buffer layer prior to formation of the indium-gallium-arsenide layer. In addition, an aluminum-gallium-arsenide interfacial layer is formed on top of the unstrained indium-gallium-arsenide layer. For strained indium-gallium-arsenide, the indium-gallium-arsenide layer can be formed on the gallium-arsenide buffer layer and a thin aluminum-gallium-arsenide layer is formed on the indium-gallium-arsenide layer.

Figure 1M:
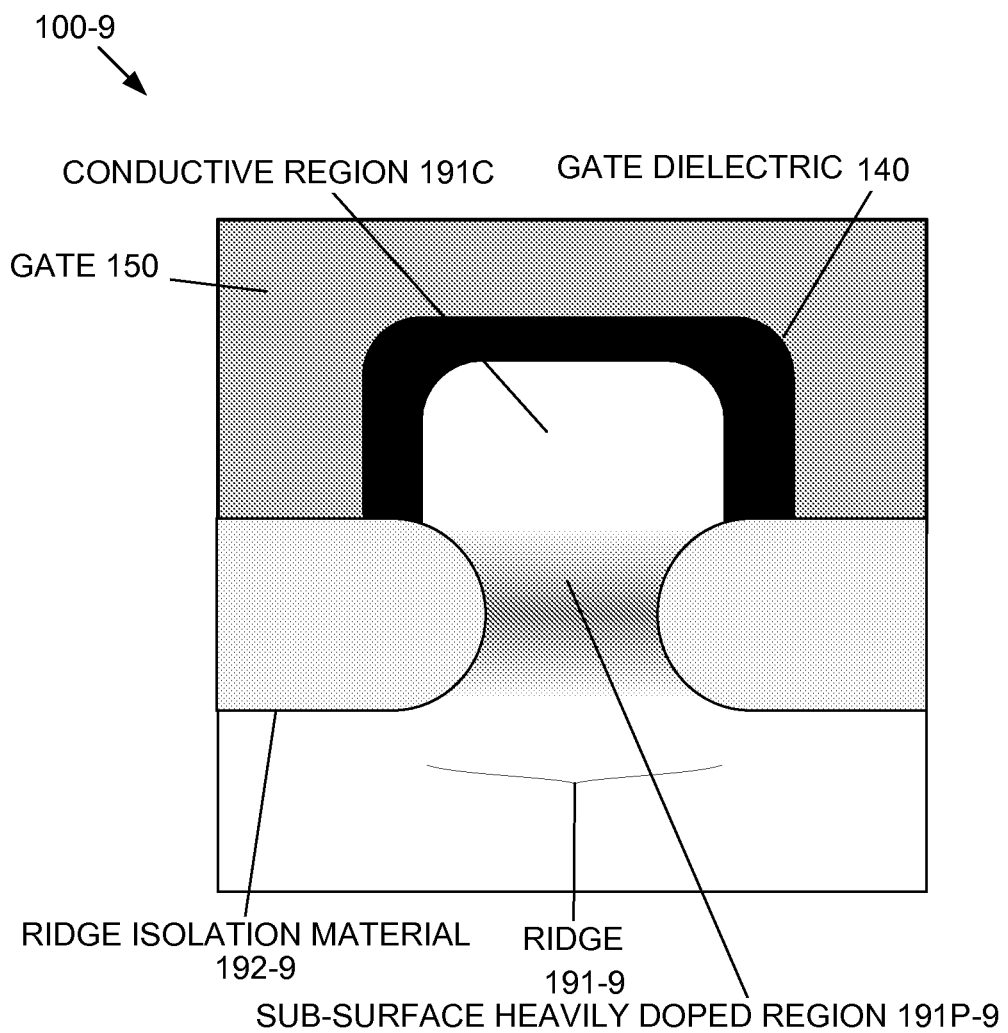

FIG. 1M shows a region around a ridge 191-9 of a transistor 100-9. FIG. 1M illustrates two optional features of the present invention that can be used (singly or together) with any of the transistors and ridges described herein. Specifically, the two features are ridges with rounded corners and ridges with narrowed base regions. FIG. 1M labels the top of ridge 191-9 as conductive region 191C to emphasize that the features of FIG. 1M can be used with any of the ridges described herein. For example, conductive region 191C could represent a multi layer region and/or a lightly doped region.

As illustrated in FIG. 1M, the top corners of conductive region 191C are rounded. Sharp corner regions may develop concentrated electric fields which could degrade transistor performance and reliability. Rounded corners would mitigate the concentrated electric fields. In accordance with one embodiment of the present invention, rounding of corners is achieved by growing a sacrificial oxide on the ridges and/or annealing the ridges in a hydrogen-containing ambient prior to gate dielectric formation.

As illustrated in FIG. 1M, the base region of ridge 191-9 is narrowed by ridge isolation material 192-9. In FIG. 1M the narrowed base region coincides with sub-surface heavily doped region 191P-9. However, in other embodiments the narrowed base region does not coincide with sub-surface heavily doped region. Narrowing the base region of ridge 191-9 reduces off-state leakage current. In accordance with one embodiment of the present invention, a barrier layer (e.g. silicon nitride) is formed along the exposed ridge surfaces to prevent oxidation of these surfaces. The ridge is than annealed in an oxidizing ambient. The oxidizing ambient allows ridge isolation material 192-9 (which is generally an oxide material such as silicon dioxide) to encroach the ridge 191-9. The barrier layer protects conductive region 191C from the oxidizing ambient.

Figure 1N:
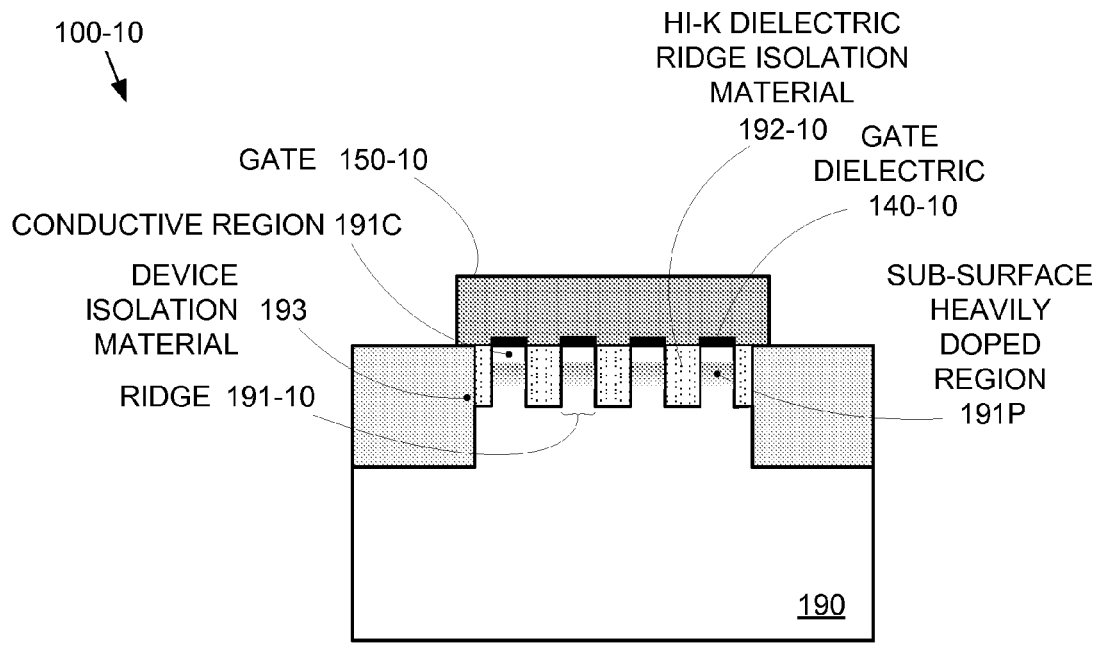
FIGS. 1N, and 1P are views of transistors including a segmented channel region.

FIG. 1N shows a transistor 100-10 that includes an optional feature of the present invention that can be used with any of the transistors and ridges described herein. Specifically, transistor 100-10 uses high-permittivity ("HI-K") dielectric material(s) for ridge isolation. Specifically, as shown in FIG. 1N, HI-K dielectric ridge isolation material 192-10 fills the spaces between the ridges and is located along the outer sidewalls of the edge ridges. The HI-K dielectric material increases the capacitive coupling between the gate electrode and the upper portion of the ridge sidewalls. Thus, the sides of upper portions of the ridges (i.e. conductive region 191C) can become conductive under the influence of gate 150-10. Gate dielectric 140-10 can be formed with silicon dioxide, a silicon oxynitride, and/or high-permittivity dielectric materials. In some embodiments of the present invention, a thin interfacial layer of silicon dioxide or silicon oxynitride is formed between the ridges and HI-K dielectric ridge isolation material 192-10 to provide a high-quality interface with the high-permittivity dielectric material. As explained in more detail below, use of high permittivity dielectric ridge isolation material 192-10 can eliminate the need to recess the ridge isolation material with an etching process (or equivalently to elevate the ridges by a selective epitaxial growth process) while obtaining the benefits provided by a "wrap-around" gate.

Figure 1P:
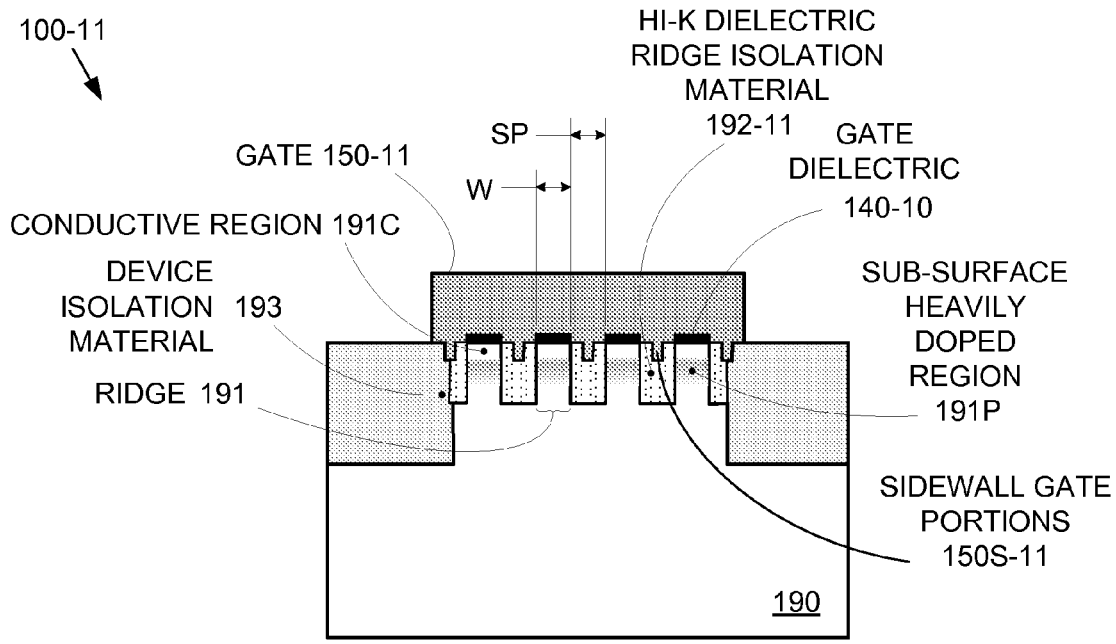

FIG. 1P shows a transistor 100-11 which is a variation of transistor 100-10. Thus only differences are discussed. Note that FIG. 1O (1 with the letter O) is not used herein to eliminate any possible confusion with the number ten. Specifically, gate 150-11 of transistor 100-11 includes sidewall gate portions 150S-11 that extend into HI-K dielectric ridge isolation material 192-11. Space for sidewall gate portions 150S-11 can be etched from HI-K dielectric ridge isolation material 192-11. However, if Hi-K dielectric ridge isolation material 192-11 is formed by conformal deposition, a gap would exist in the center of each HI-K dielectric ridge isolation material 192-11. The gap would be filled during the formation of gate 150-11 to create sidewall gate portions 150S-11.

Ridges 191 in transistor 100 ideally exhibit a high degree of regularity and consistency to allow optimal functioning of transistor 100. In other words, each of ridges 191 should ideally be dimensionally consistent with every other ridge 191. Furthermore, ridges 191 should be relatively narrow and have tight pitch to allow for maximum flexibility in transistor design and layout efficiency in an IC. For example, it may be desirable to set ridge width W to be comparable to the minimum gate length (e.g., 45 nm) for transistors in the IC, with average pitch comparable to twice the minimum gate length. However, conventional lithographic methods used in semiconductor manufacturing are not able to easily provide such fine-pitched features. Specifically, the optical lithography methods used to define structures in modern semiconductor manufacturing processes use an exposure wavelength of 193 nm, and such methods can only directly produce structures down to ~45 nm in lateral dimension with greater than 130 nm pitch through the use of various optical techniques that attempt to compensate for the lack of actual exposure resolution. For example, techniques such as optical proximity correction (OPC) and phase shift masking (PSM) make use of modified masks that make use of diffraction and interference effects to form pattern features that are smaller than the wavelength of the exposure light. Therefore, the use of double patterning (or multiple patterning) techniques may be used to form ridges of uniform width with very fine pitch using conventional lithography.

Figure 2A:
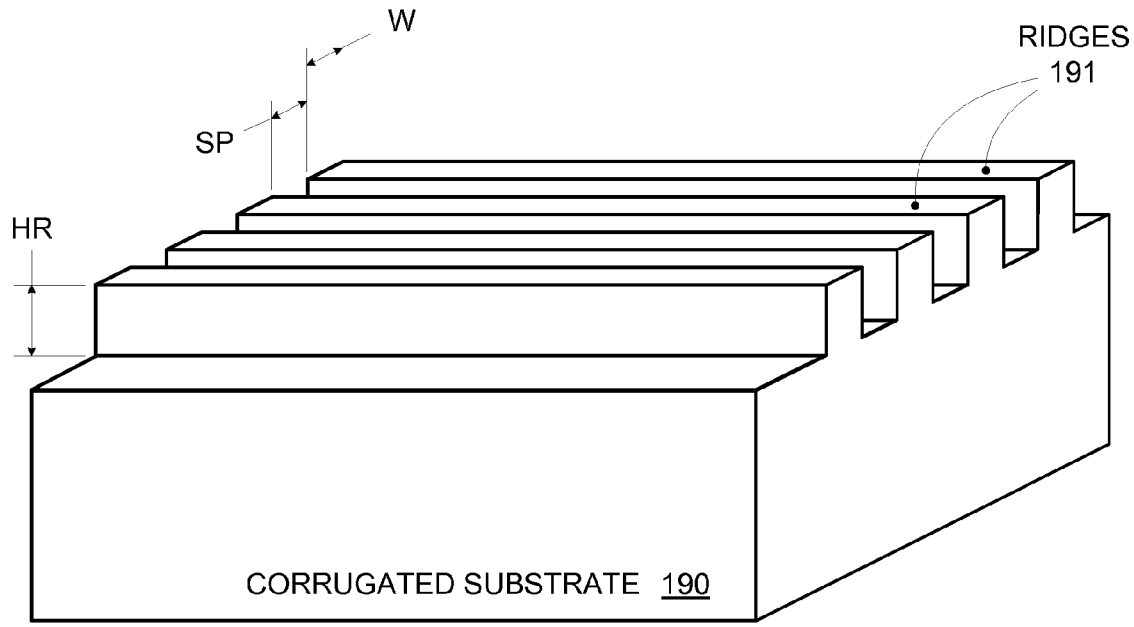

Advantageously, by forming transistor 100 on a set of pre-existing ridges 191, many of the limitations associated with conventional lithographic methods used in semiconductor manufacturing can be overcome. For example, FIG. 2A shows an exemplary corrugated substrate 190 that includes a set of ridges 191. Each of ridges 191 has a height HR and a width W. Because ridges 191 are made prior to any specific device patterning, various processing techniques can be used to generate ridges 191 with a high degree of accuracy and regularity. For example, imprint lithography is a technique in which a master stencil is precisely patterned using electron-beam lithography. The master stencil is then used to pattern wafers (e.g., by imprinting a resist pattern onto a wafer), thereby enabling the formation of precise, sub-wavelength features on those wafers. Due to the complexity of most IC layouts, imprint lithography is generally not practical for use on production wafers. However, the technique is ideal for creating regular, repeating patterns on a wafer, such as ridges 191. The use of imprint lithography can allow ridges 191 to be created with extremely precise and regular dimensions, thereby avoiding the inherent inaccuracies associated with optical lithography. Other techniques for forming ridges 191 such as spacer lithography (described in the publication by Y.-K. Choi et al., "A spacer patterning technology for nanoscale CMOS," IEEE Transactions on Electron Devices, Vol. 49, No. 3, pp. 436-441, 2002), in which narrow hard-mask features are formed by conformally depositing then anisotropically etching a thin hard-mask film to form spacers of uniform width along the sidewalls of sacrificial features which are subsequently etched away, will be readily apparent.

Note that while ridges 191 are described as being formed from the same material as the underlying bulk substrate (i.e., the non-ridged portion of corrugated substrate 190) for exemplary purposes, according to various other embodiments of the invention, ridges 191 can comprise another semiconductor material or other materials. For example, each ridge 191 could include a silicon layer formed over a silicon-germanium alloy layer. Alternatively, each ridge 191 could include a semiconductor layer formed over an insulator layer. Furthermore, according to various other embodiments, ridges 191 can include any type of semiconductor material (e.g., compound semiconductors or carbon nanotubes).

Figure 2B:
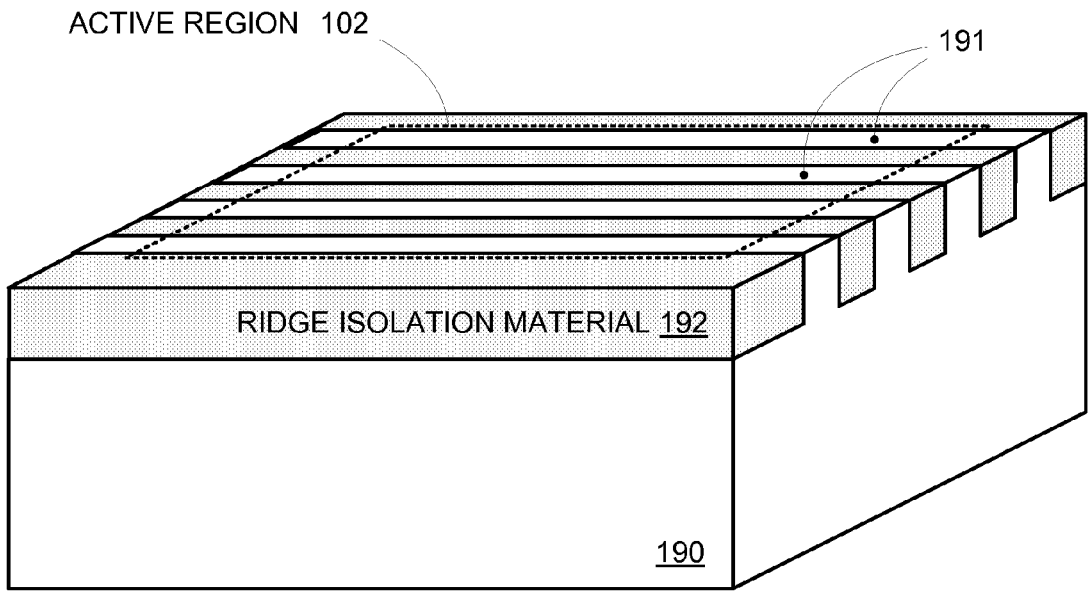

To prepare a corrugated substrate 190 for semiconductor device fabrication, a ridge isolation material 192 is formed around and between semiconductor ridges 191, as shown in FIG. 2B. A planarization operation may be used to ensure that the top surface of ridge isolation material 192 is aligned with the tips of ridges 191. In some embodiments of the present invention, a high-permittivity dielectric material is used for ridge isolation material 192. (See FIG. 1N and FIG. 1P.) Note that if corrugated substrate is an SOI substrate (e.g., with ridges 191 formed on an insulation layer), or if ridges 191 themselves include an insulating layer, ridge isolation material 192 can be eliminated.

An active region 102 (indicated by the dotted line) is then defined to specify the location for the final transistor(s). Just as in processes used to form conventional ICs, the areas in which the semiconductor devices (i.e., transistors, resistors, and/or capacitors) and/or local interconnects formed in semiconductor material are to be formed can be masked (typically by a lithographic operation). Note that while active region 102 is depicted as spanning four ridges 191 for exemplary purposes, in various other embodiments active region 101 can cover any number of ridges 191, depending on the desired characteristics of the final transistor(s) 100. For example, active region 102 could span a single ridge 191, thereby allowing formation of the final transistor 100 as a FinFET.

Figure 2C:
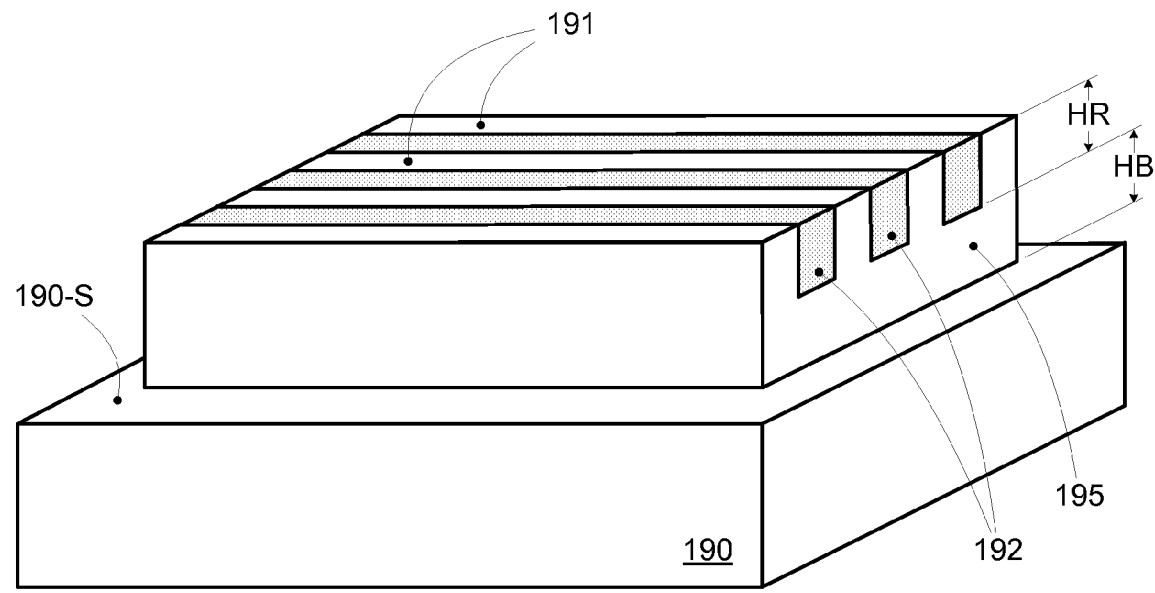

Once active region 102 is defined, ridges 191 and ridge isolation material 192 can be selectively removed in the "field" areas surrounding the active areas (typically by one or more etch operations), as shown in FIG. 2C. This etch operation(s) may reduce the field areas of substrate 190 to a depth greater than the ridge height HR, and it may also partially or completely remove the ridge isolation material 192 in the field regions. Note that elevated base region 195 can be formed by allowing the etch operation(s) to remove material from substrate 190 below the base of ridges 191 in the field regions. Note further that if a single etch is used, the subsequently formed surface 190-S of substrate 190 may exhibit a slightly irregular profile, due to the typically different etch rates of ridge isolation material 192 (e.g., silicon oxide) and ridges 191/substrate 190 (e.g., silicon).

Figure 2D:
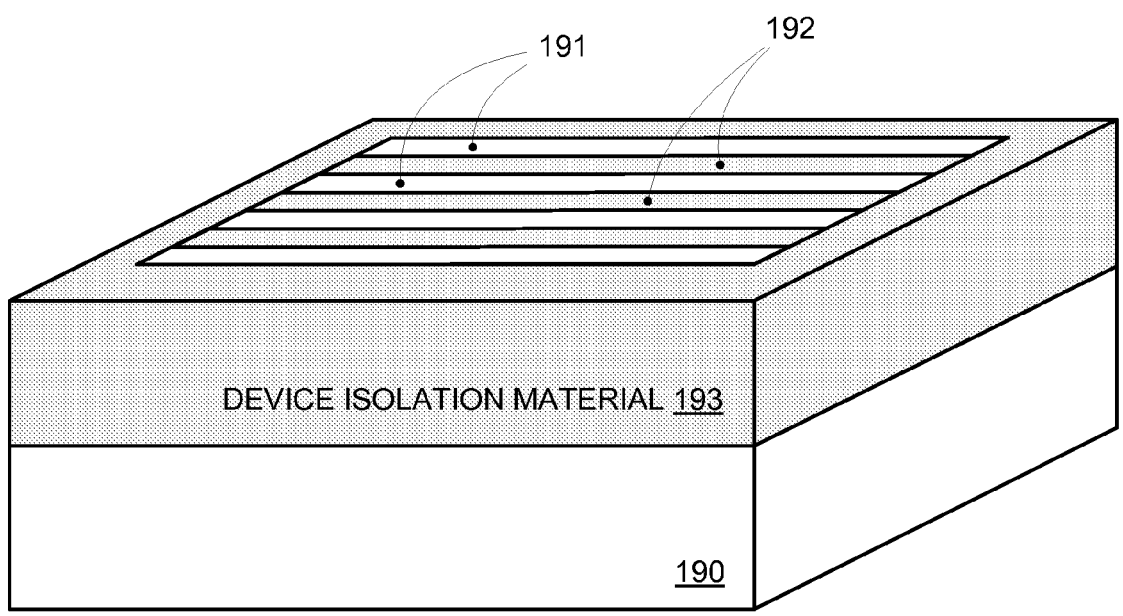

After the active region formation step of FIG. 2C, the field regions are filled with device isolation material 193, as shown in FIG. 2D. Just as described above with respect to the formation of ridge isolation material 192, a planarization operation can be performed to ensure that the top surface of device isolation material 193 is aligned with the top surfaces of ridges 191. Note that the depth of device isolation material 193 is determined by the depth to which the active region definition operation reduces substrate 190 (i.e., distance HB below the base of ridges 191). In one embodiment, device isolation material 193 can be selected to have an etch rate similar to that of ridge isolation material 192, thereby allowing uniform (subsequent) selective etching to expose the tips of ridges 191, as described in greater detail below. Note that if corrugated substrate is an SOI substrate (e.g., with ridges 191 formed on an insulation layer), or if ridges 191 themselves include an insulating layer, device insulation material 193 can be eliminated.

As illustrated in FIG. 2D2, in one embodiment, ridges 191 may be selectively etched to form channels defined by the remaining ridge isolation material 192 and device isolation material 193. These channels can be filled with one or more layers of semiconductor material (e.g., silicon, germanium, or silicon-germanium alloy), thereby creating precisely vertically engineered semiconductor ridges. For example, sub-surface heavily doped region 191P-5 (FIG. 1L) could be epitaxially grown in the channels. Because the defect density of epitaxially grown semiconductor films is dramatically reduced by spatial confinement, this "etch-refill" approach can provide significant benefit for manufacturing heterostructure semiconductor channel films with low defect density (i.e. high yield). In one embodiment, the layering of semiconductor materials having different lattice constants can provide beneficial stress within ridges 191 to improve final device performance.

Next, in FIG. 2E, ridge isolation material 192 and field insulation material 193 may be optionally selectively etched a distance HG below the top surfaces of ridges 191.

Figure 2E:
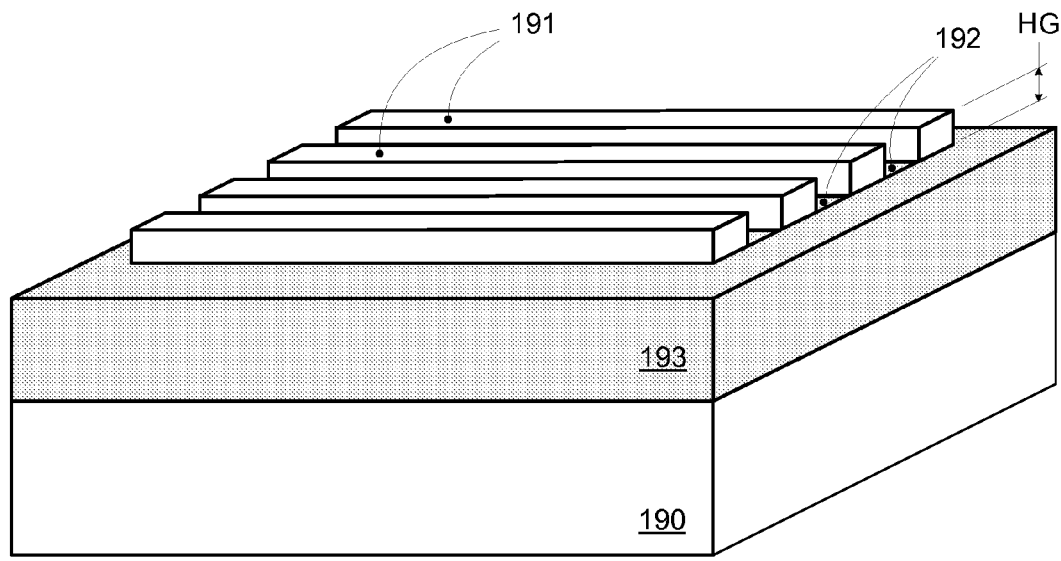

Alternatively, as shown in FIG. 2E2, ridges 191 can be extended upwards by selective epitaxial growth. In many embodiments of the present invention, heavy doping by ion implantation is used to form a sub-surface heavily doped region prior to epitaxial growth of the ridges. In other embodiments of the present invention sub-surface heavily doped regions are also formed by epitaxial growth of the ridges. A novel sequential selective epitaxial growth process flow that can be used to epitaxially grow the sub-surface heavily doped regions for complementary MOS (CMOS) device is described below. The exposed portion of the ridges in FIG. 2E2 could for example represent lightly doped regions 191L-5 (FIG. 1I), portions of sub-surface heavily doped region 191P-6 and lightly doped region 191L-6 (FIG. 1J), lightly doped region 191L-7 covering portions of sub-surface heavily doped region 191P-7 (FIG. 1K), or multi layer region 191M-8 (FIG. 1L). FIG. 2E2 can also represent the continuation from FIG. 2D2 in which ridges are first selectively etched and then built up epitaxially.

Figure 2F:
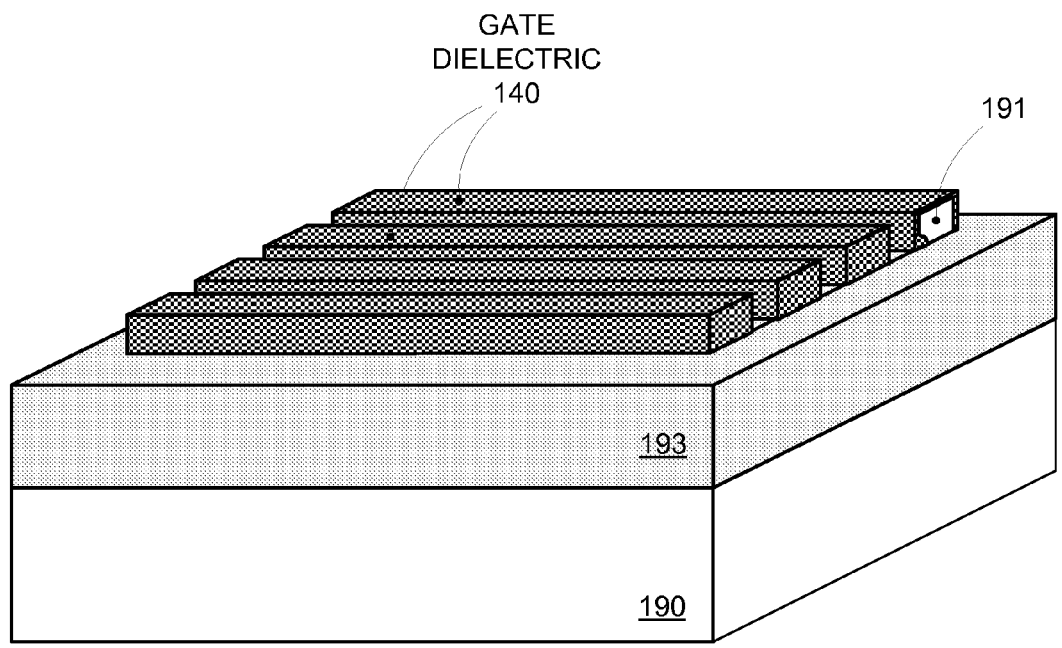
Figure 2G:
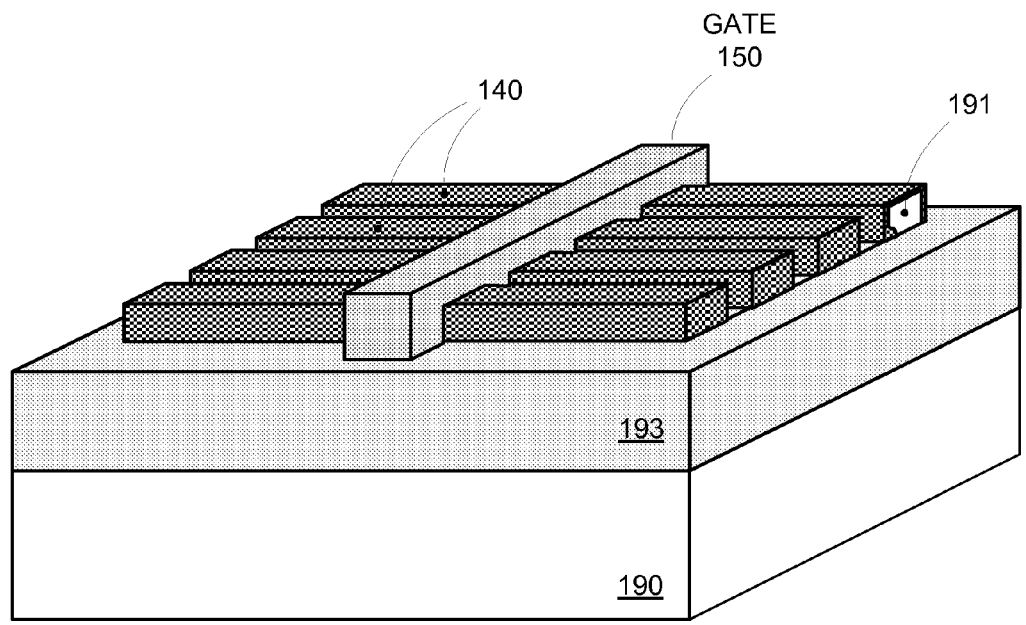

The exposed tips of ridges 191 are then covered with gate dielectric layer(s) 140, as shown in FIG. 2F, and a gate 150 is formed over the desired channel region for transistor 100, as shown in FIG. 2G. In some embodiments of the present invention an additional fill process may be used to extend ridge isolation material 192 and device isolation material 193 to the top of ridges 191 after epitaxial growth of the ridges.

Note that in some embodiments, ridge isolation material 192 and device isolation material 193 may be selectively etched in the channel region below the top surfaces of ridges 191 to expose the top or sidewalls of one or more buried layers within the ridges, and the one or more buried layers within the ridges may then be selectively removed in this region so that one or more remaining semiconductor layers within the ridges form bridge(s) in the channel region. Then the exposed surfaces of the semiconductor layers are covered with gate dielectric 140 and gate 150, which as a result wrap around the semiconductor bridges (which also re-forms the portions of ridges 191 removed during the selective etch process), as described in "Silicon-on-Insulator 'Gate-All-Around Device'", by J. P. Colinge et al., *International Electron Devices Meeting Technical Digest*, pp. 595-598, 1990 and also in "A Novel Sub-50 nm Multi-Bridge-Channel MOSFET (MBCFET) with Extremely High Performance," by S.-Y. Lee et al., *Symposium on VLSI Technology Digest of Technical Papers*, pp. 200-201, 2004. Note that if corrugated substrate is an SOI substrate (e.g., with ridges 191 formed on an insulation layer), or if ridges 191 themselves include an insulating layer, then the initial isolation material etch is not necessary.

Figure 2H:
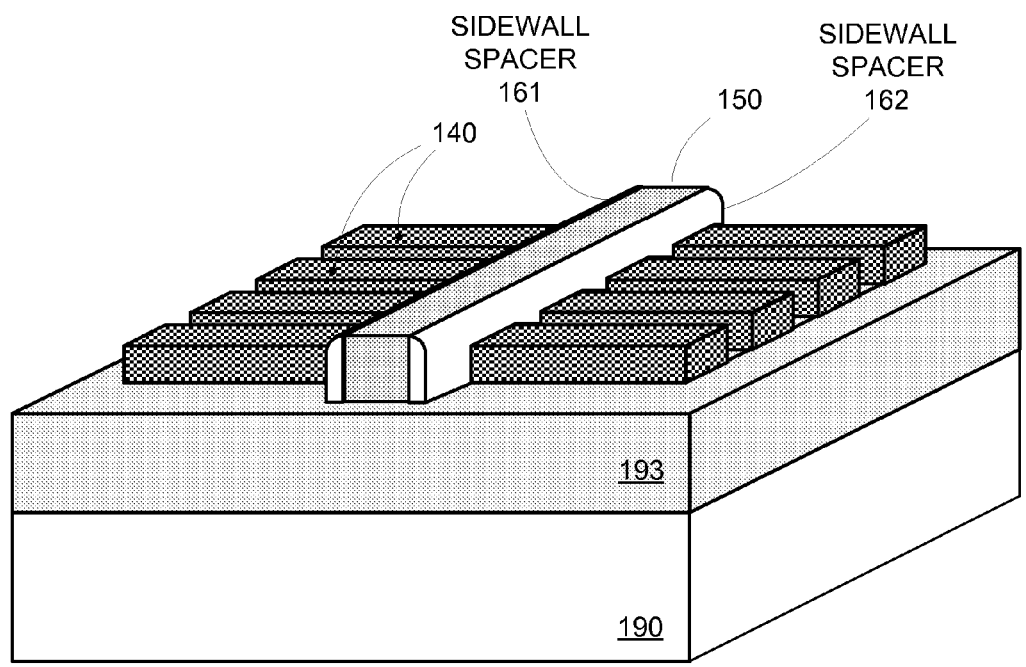
Figure 2I:
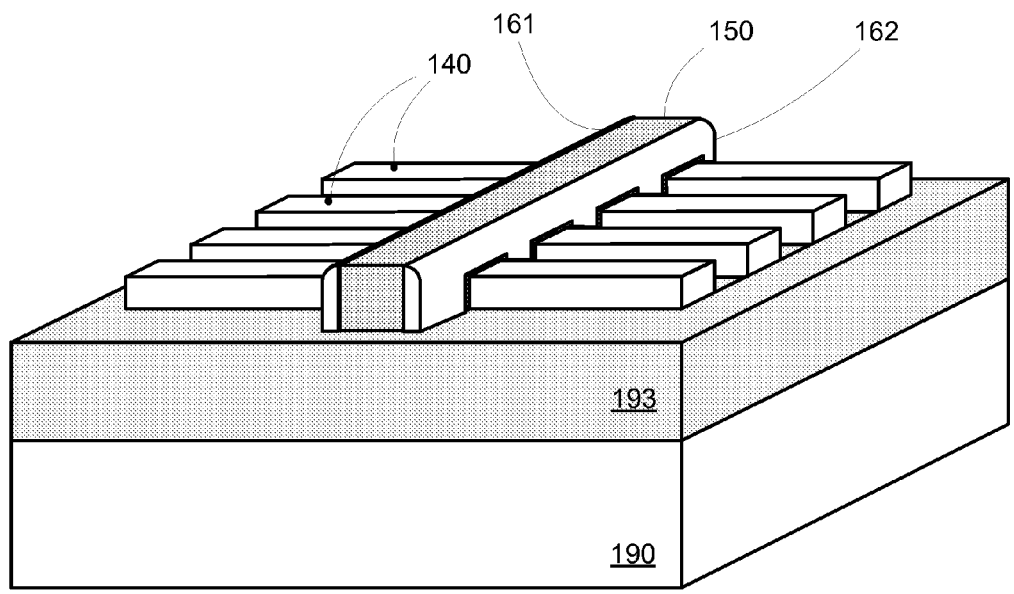

At this point, an optional doping operation (e.g., a low-energy ion implantation operation) can be performed on the exposed tips of ridges 191 to form a source extension (i.e., 110-L in FIG. 1C) and a drain extension (i.e., 130-L in FIG. 1C) for transistor 100. Sidewall spacers 161 and 162 may then be formed on either side of gate 150, as shown in FIG. 2H, after which one or more heavy doping operations may be performed to form source (110 in FIG. 1C) and drain (130 in FIG. 1C) regions for transistor 100. Note that some degree of over-etch may be used in the anisotropic etch process used to form the gate-sidewall spacers, in order to avoid the formation of spacers along the sidewalls of the ridges. The exposed portions of gate dielectric layer(s) 140 (i.e., the portions of gate dielectric layer(s) 140 that are not covered by gate 150) may then be removed as shown in FIG. 2I.

Figure 2J:
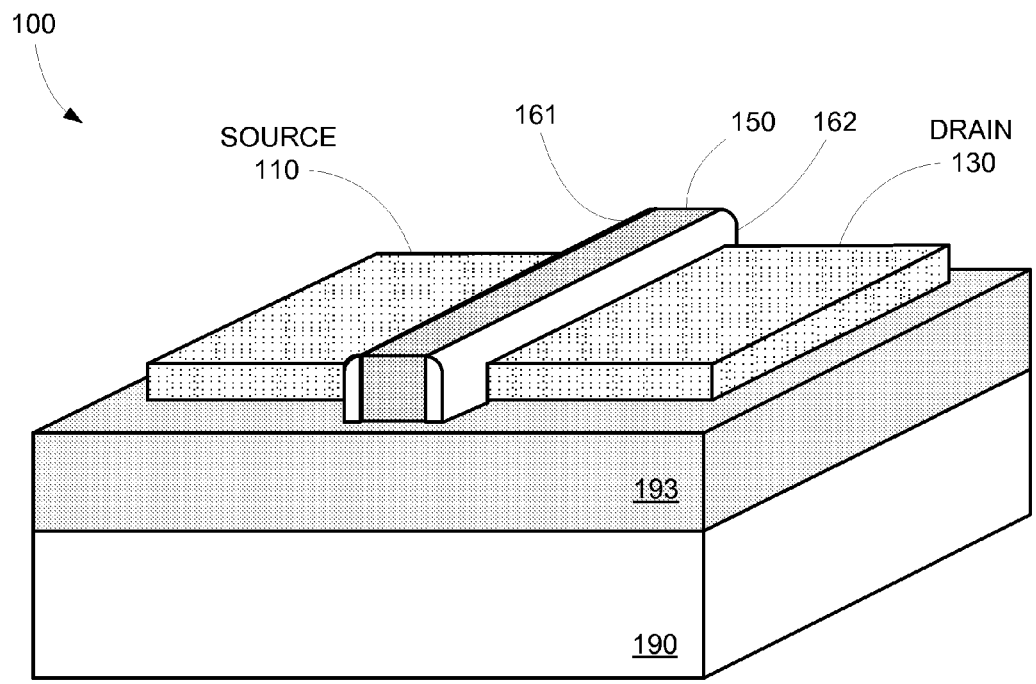

Then, to simplify subsequent source and drain contact formation, the spaces between the exposed portions of ridges 191 can be optionally filled with semiconductor material (which can either be the same material from which ridges 191 are formed or one or more different semiconductor materials), as shown in FIG. 2J. Note that sidewall spacers 161 and 162 can help to isolate gate 150 from the fill material deposited or grown in FIG. 2J. Note that this fill operation may involve filling just the spaces between ridges 191, forming a blanket layer of semiconductor material over ridges 191, "growing" additional material on ridges 191, or any combination of the above. The semiconductor material may be doped in-situ during the deposition/growth process, or it may be doped with a separate doping operation (e.g., a high-dose ion implantation operation). Note that any desired well and/or channel doping (e.g., pulse-shaped doping, halo doping, or pocket doping, among others) process steps could be performed any time up to this point. Note further that as described with respect to FIG. 1C, any portion of the source/drain extensions and/or source/drain regions may be transformed into a metal-semiconductor compound (e.g., silicide, germanide, or germanosilicide, among others), either before or after the fill operation. In some embodiments, this process is used to form the source/drain regions.

Note further that the physical characteristics of source 110 and drain 130 can vary depending on the process used to create the fill material around ridges 191. For example, the fill material (as described with respect to the formation of source 110 and drain 130 in FIG. 2J) may be formed using epitaxial growth, thereby causing source 110 and drain 130 to exhibit a very homogeneous structure. Alternatively, conformal deposition may be used such that source 110 and drain 130 exhibit a "striped" structure, with ridges 191 alternating with the new fill material. In such a circumstance, source 110 and drain 130 can include discrete structures that are continuous with ridges 191 in the channel region.

Note also that in one embodiment, the exposed portions of ridges 191 can be etched prior to epitaxial growth of the filler material. By then growing an appropriate semiconductor material over the reduced-height (or completely eliminated, if the etch removes material down to elevated base region 195 shown in FIGS. 1B-1D or below) portions of ridges 191, a desired stress can be induced in the portions of ridges 191 beneath gate 150 (i.e., in the channel region of transistor 100).

For example, by etching the exposed portions of ridges 191 and then growing silicon-germanium alloy ($Si_{1-x}Ge_x$) in the source/drain contact regions, compressive uniaxial stress can be induced in the channel region to enhance the mobility of holes, thereby providing enhanced p-channel MOSFET performance. On the other hand, growing silicon-carbon alloy ($Si_xC_{1-x}$), rather than silicon-germanium, would induce tensile uniaxial stress in the channel region to enhance the mobility of electrons, thereby providing enhanced n-channel MOSFET performance. As noted above, the confinement of epitaxial growth to small-dimensioned regions (such as source 110 and drain 130 in FIG. 2J) helps to reduce the defect density in the epitaxially grown material, which allows maximum stress levels to be achieved. This in turn enables the generation of consistent stress levels from transistor to transistor, thereby enhancing the uniformity of transistor performance across an IC.

Note that in another embodiment, a portion of the ridges underneath the gate may be selectively removed and optionally refilled (e.g. with an insulating material), prior to epitaxial growth of the filler material, in a manner similar to that described in "Silicon-on-Nothing (SON)—an Innovative Process for Advanced CMOS" by M. Jurczak et al., *IEEE Transactions on Electron Devices*, Vol. 47, No. 11, pp. 2179-2187, November 2000. Note that in another embodiment, the etched portions of ridges 191 (on either side of gate 150) can each be covered with a blanket layer of semiconductor material (different than the ridge material) to define the regions for source 110 and drain 130.

Alternatively, some embodiments of the present invention do not fill the spaces between the ridges in the source and drain regions with conductive material. Extra large contacts that span the entire width of the segmented transistor can be used to interconnect all the ridges underneath the source contact region 171 and drain contact region 172. Note that if the depth D of source 110 and drain 130 extends below the base of ridge 191 (i.e. D is greater than HR as shown in FIG. 1C), the ridges underneath the source contact region 171 comprise a single doped region and hence are electrically connected, and the ridges underneath the drain contact region 172 comprise a single doped region and hence are electrically connected, so that extra large contacts are not necessary to interconnect all the ridges in the source contact region 171 and drain contact region 172.

Figure 2K:
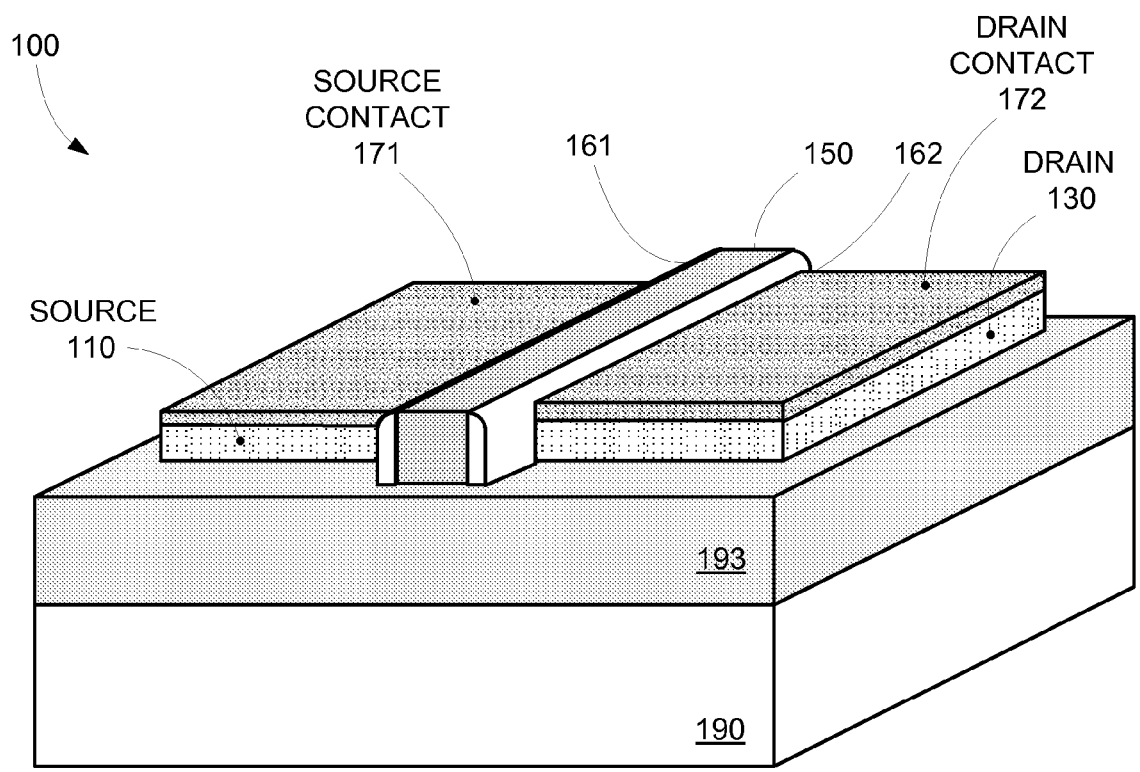

In any case, to complete transistor 100, source contact region 171 and drain contact region 172 are formed over source 110 and drain 130, respectively, and directly abutting sidewall spacers 161 and 162, respectively, as shown in FIG. 2K. Note that while contacts can be made to the exposed ridges 191 (in which case the source contact region 171 and drain contact region 172 would simply consist of the exposed portions of ridges 191) shown in FIG. 2I without undue difficulty, device manufacturers generally prefer to form contacts on planar surfaces, such as depicted for source 110 and drain 130 in FIGS. 2J and 2K. In various embodiments, source contact region 171 and drain contact region 172 may each be comprised in part of a metal-semiconductor compound such as silicide, germanide, or germanosilicide to provide lower contact resistance. Note that according to various embodiments, additional stress engineering structures (e.g., a stressed capping layer over gate 150, source 110, and drain 130) can be subsequently formed on transistor 100 (as described with respect to FIG. 1B).

Figure 6A:
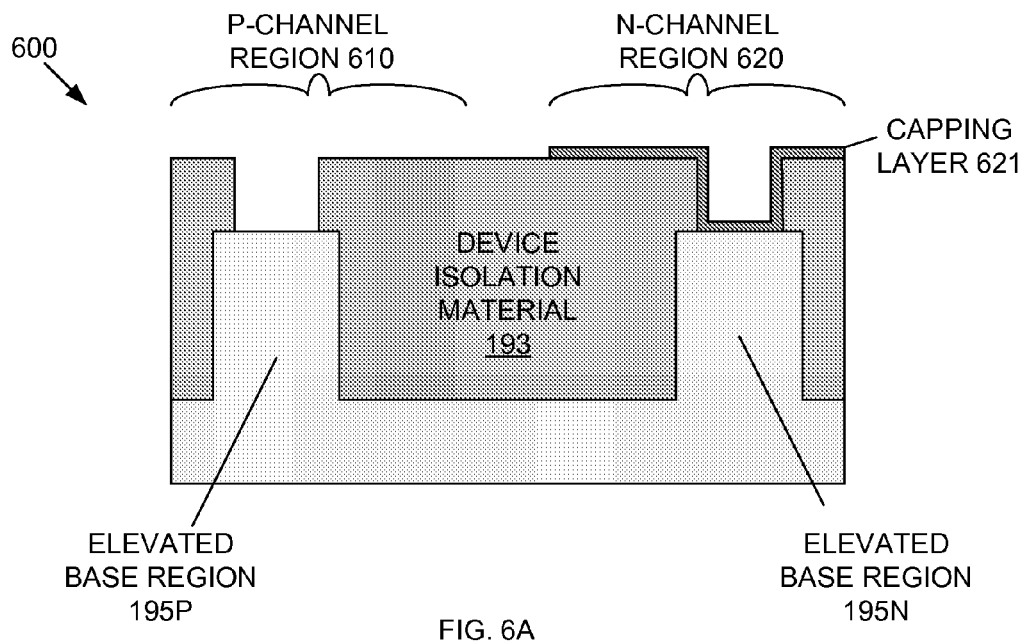
FIGS. 6A-6D are steps in a novel manufacturing process for creating complementary MOS (CMOS) devices using epitaxially grown material.
Figure 6B:
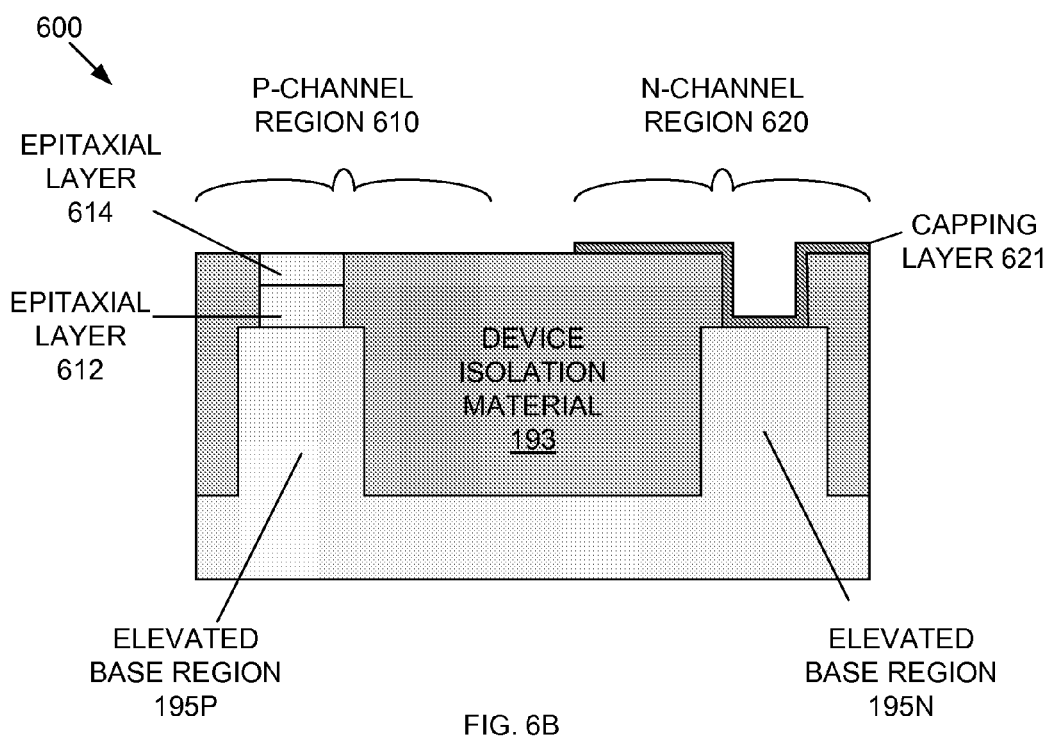
Figure 6C:
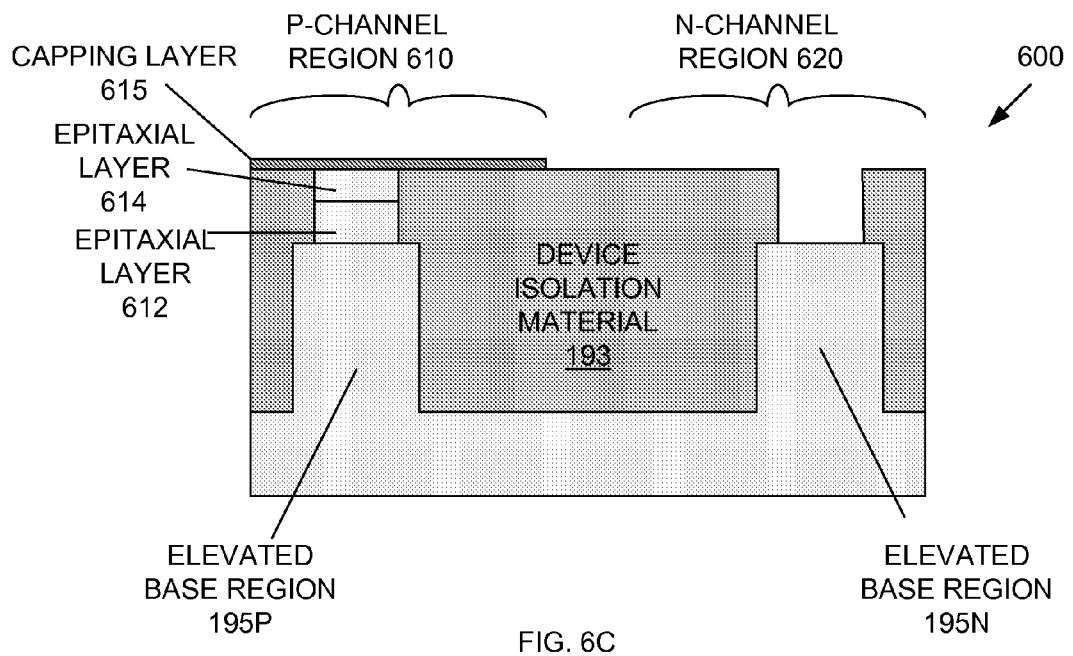
Figure 6D:
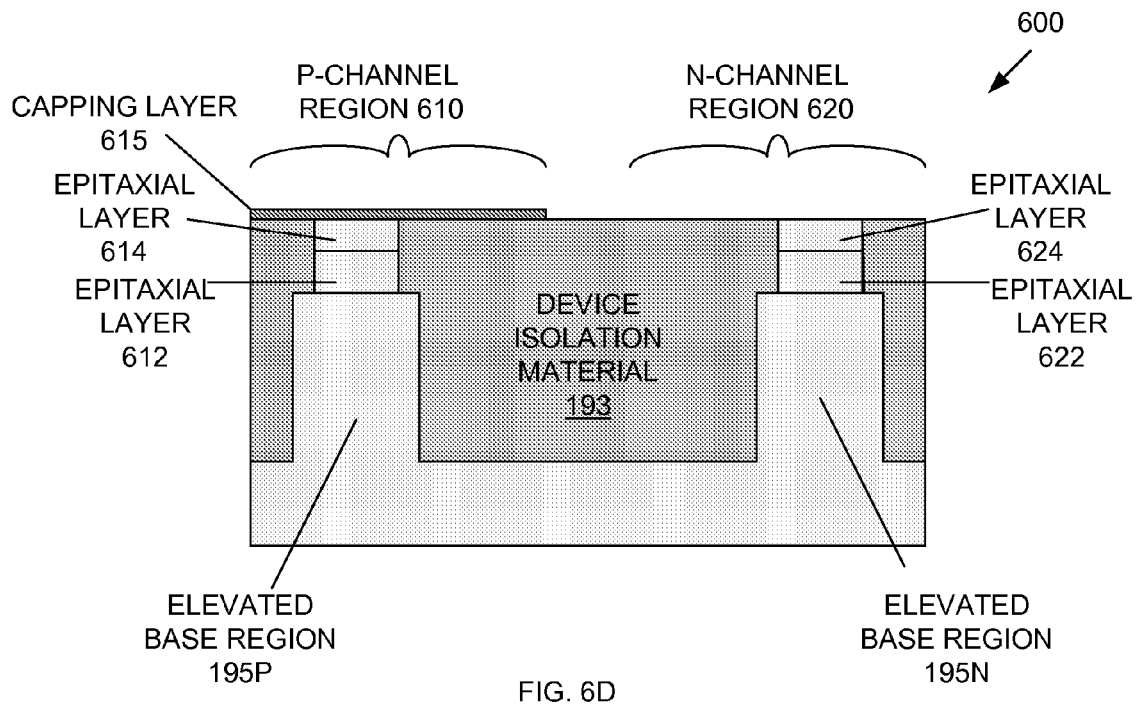

As described above, some embodiments of the present invention use epitaxial growth to form heavily doped regions (e.g. the sub-surface heavily doped region 191P). However, n-channel devices use p-type dopants for sub-surface heavily doped regions while p-channel devices use n-type dopants for sub-surface heavily doped regions. Thus, many embodiments of the present invention may use a novel sequential selective epitaxial growth process flow for complementary MOS (CMOS) integrated circuits. FIGS. 6A-6D illustrate the novel process flow using a simplified CMOS integrated circuit 600 having a p-channel region 610 for a p-channel device to be formed on elevated base region 195P and a n-channel region 620 for a n-channel device to be formed on elevated base region 195N. Device isolation material 193 separates elevated base region 195P and elevated base region 195N. An actual integrated circuit may have millions of p-channel regions and n-channel regions. As shown in FIG. 6A, a capping layer 621 is formed over n-channel region 620. Capping layer 621 could be for example an oxide, a nitride or other material. Then as shown in FIG. 6B, a first epitaxial layer 612 is epitaxially grown with n-type dopants (if desired) in p-channel region 610 followed by a second epitaxial layer 614. Capping layer 621 prevents epitaxial growth on elevated base region 195N in n-channel region 620. Although only two epitaxial layers are illustrated in FIGS. 6A-6D in each region, the layers could represent multiple layers. For example, first epitaxial layer 612 could be a heavily doped layer used to form sub-surface heavily doped region 191P-8 (FIG. 1L) and second epitaxial layer 614 could represent multiple layers to form multi layer region 191M-8 (FIG.1L). After formation of the epitaxial layers in p-channel region 610, capping layer 621 is removed. Then as illustrated in FIG. 6C, a capping layer 615 is formed over p-channel region 610 including newly formed epitaxial layer 614. Then as shown in FIG.6D, a first epitaxial layer 622 is epitaxially grown with p-type dopants (if desired) in n-channel region 620 followed by a second epitaxial layer 624. Capping layer 615 prevents epitaxial growth in n-channel region 620. After formation of epitaxial layer 624, capping layer 615 is removed and fabrication of CMOS integrated circuit 600 can proceed as described above. Note that although the selective epitaxial growth is described as being performed firstly in the p-channel region 610 and secondly in the n-channel region 620 for exemplary purposes, according to various other embodiments the selective epitaxial growth can be performed firstly in the n-channel region 620 and secondly in the p-channel region 610.

Figure 3A:
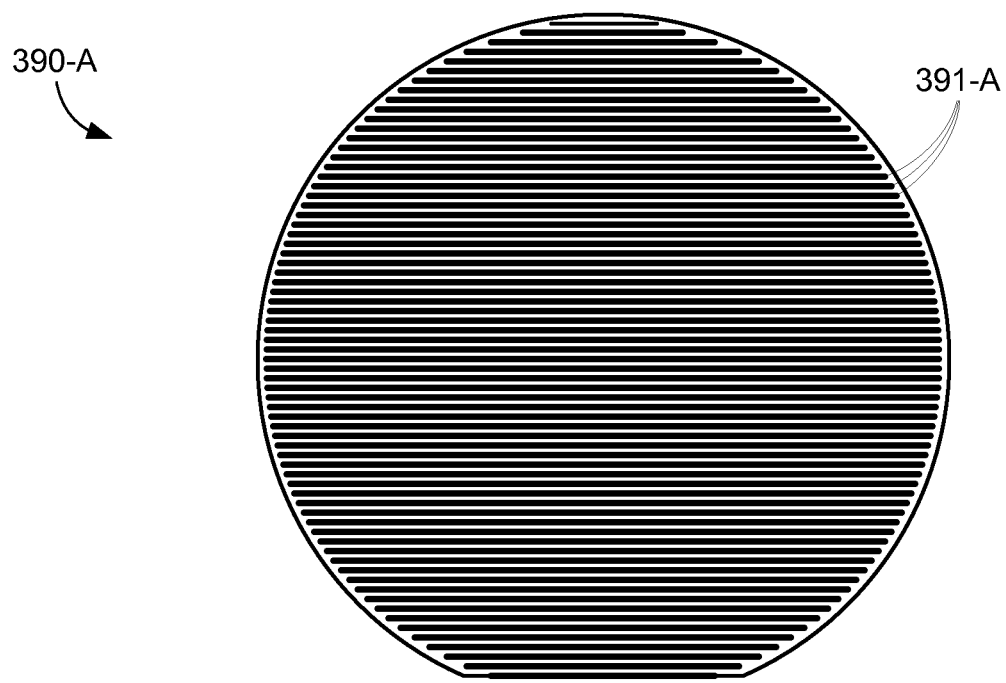
FIGS. 3A, 3B, 3C, and 3D are top views of different corrugated substrates that can be used in the manufacture of ICs that incorporate transistors having segmented channel regions.

As described above with respect to FIG. 2A, by creating ridges 191 as standalone structures prior to discrete device definition, ridges 191 can be formed with a high degree of precision (±15% tolerances and better) using techniques that would not necessarily be suitable for general IC production (e.g., imprint lithography and spacer lithography). In one embodiment, a semiconductor wafer can be fully patterned with such ridges, thereby allowing subsequent formation of transistor(s) 100 at any desired location on the wafer. For example, FIG. 3A shows a top view of a wafer 390-A that includes an array of ridges 391-A running across almost the entire wafer surface. Ridges 391-A are substantially similar to ridges 191 described previously, and have a predetermined height (HR in FIG. 2A), width (W in FIG. 2A) and composition (e.g., silicon, silicon-germanium, silicon on silicon-germanium, or carbon nanotubes, among others). By forming ridges at the wafer level, IC production costs are minimally impacted, since this type of simple bulk patterning is much less complex (and therefore much less expensive) than the localized feature formation performed during subsequent IC processing. Note that in one embodiment, wafer 391-A can include ridge isolation material (e.g., ridge isolation material 192 shown in FIG. 2B) between ridges 391-A.

Figure 3B:
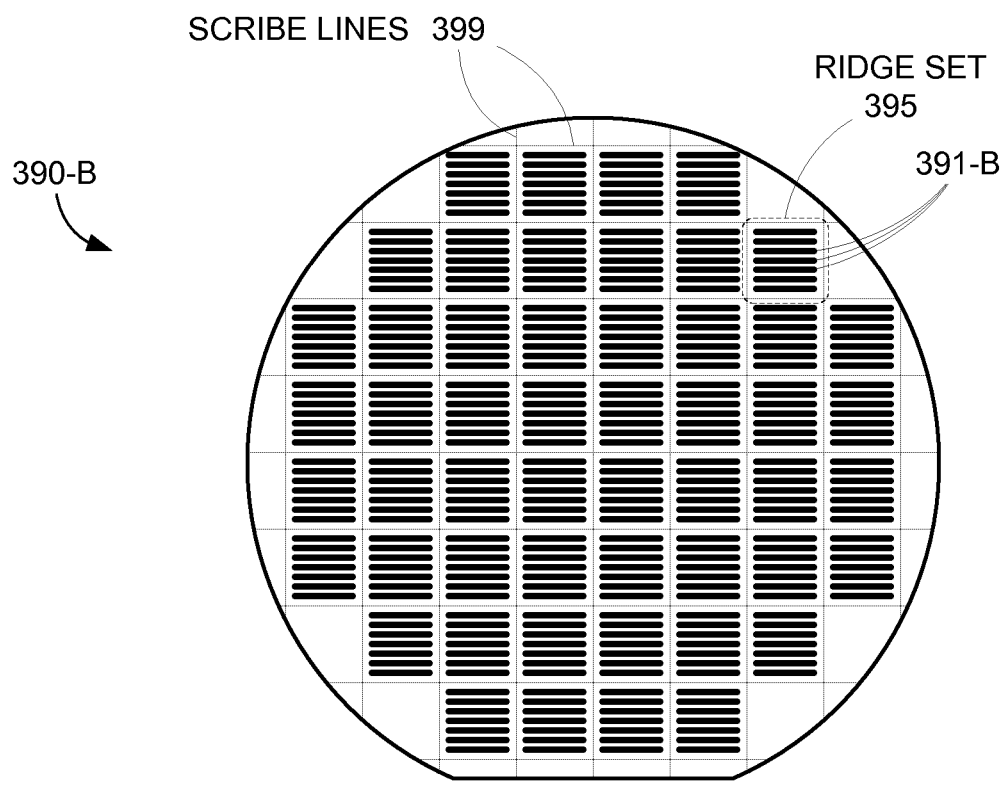

Note further that in various other embodiments, a corrugated substrate can include localized groupings of parallel ridges, rather than the continuous ridges 391-A that span the entire wafer surface as shown in FIG. 3A. For example, FIG. 3B shows another embodiment of a corrugated substrate 390-B that includes localized ridge sets 395. Each localized ridge set includes ridges 391-B that exhibit the same dimensional and physical consistency as described with respect to ridges 391-A shown in FIG. 3A, but are discontinuous across scribe lines 399, which can simplify subsequent IC formation and wafer dicing operations. Therefore, each die location on corrugated substrate 390-B (i.e., each location where an IC is to be formed) includes a separate ridge set 395. As described with respect to FIG. 3A, ridge sets 395 can also include ridge isolation material between ridges 391-B. Note that in some embodiments, within each ridge set 395, localized groupings of ridges 391-B may exhibit different material compositions (as described in greater detail below with respect to FIG. 4A).

Figure 3C:
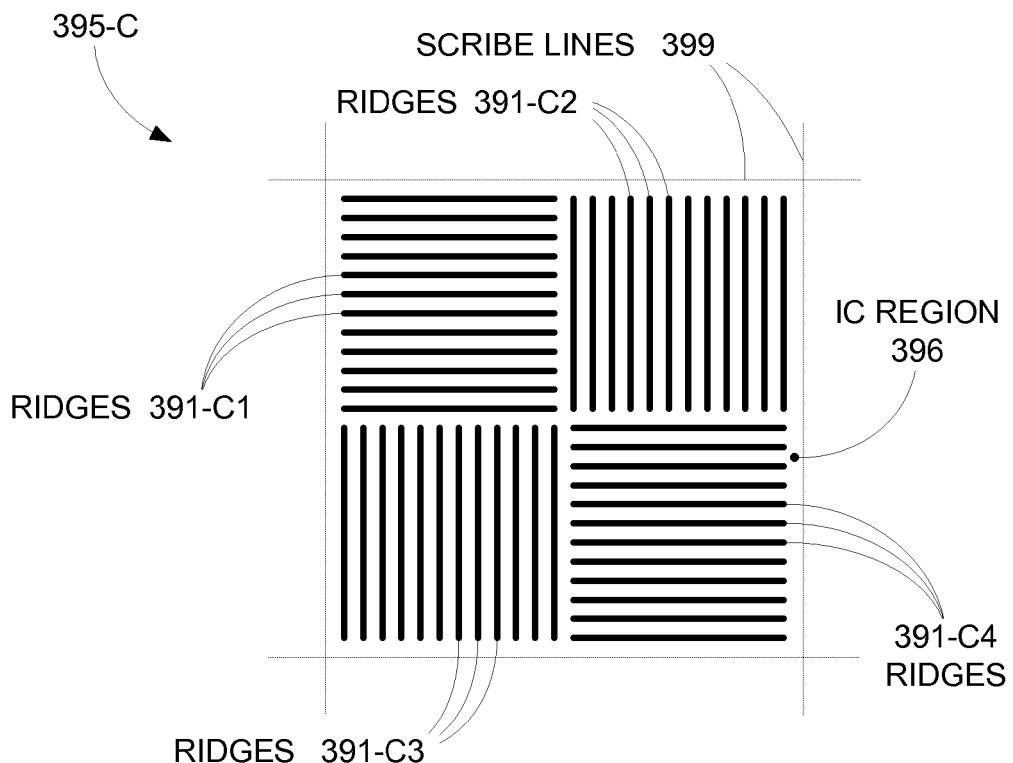

Note further that while ridges 391-B are all shown running in the same direction for exemplary purposes, according to various other embodiments, a corrugated substrate can include multiple localized ridge sets, wherein the ridges in different sets run in different directions. For example, FIG. 3C shows a top view of an alternative localized ridge set 395-C that could be implemented in place of localized ridge sets 395 in FIG. 3B. Localized ridge set 395-C includes a ridge set including parallel ridges 391-C1, a ridge set including parallel ridges 391-C2, a ridge set including parallel ridges 391-C3, and a ridge set including parallel ridges 391-C4. As described with respect to FIG. 3B, optional ridge isolation material can separate the ridges in each of the ridge sets. Parallel ridges 391-C1 and 391-C4 run perpendicular to parallel ridges 391-C2 and 391-C3. Any other arrangement of ridges can provide the benefits described above, so long as the ridges in any particular set of parallel ridges are longer than the critical dimension (i.e., the minimum geometry) of the devices being formed using the ridges. Note, however, that the ridges themselves may actually be thinner than the critical dimension (since the ridges can be manufactured using techniques other than those ordinarily used in actual device production, as described above). Note further that while the areas occupied by parallel ridges 391-C1, 391-C2, 391-C3, and 391-C4 are depicted as being roughly equal for exemplary purposes, the different ridge groupings within a die location (i.e., between scribe lines) can exhibit any desired sizing relationship with one another.

Figure 3D:
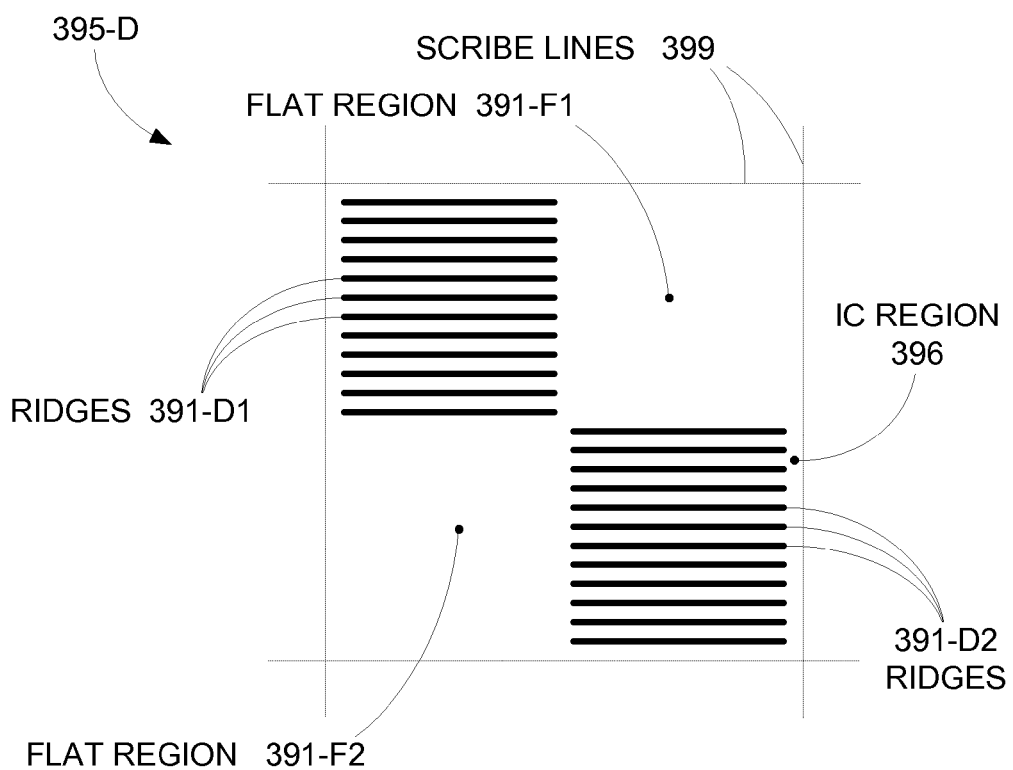

Note further that a corrugated substrate can include large planar semiconductor surface regions. For example, FIG. 3D shows a top view of an alternative localized ridge set 395-D that could be implemented in place of localized ridge sets 395 in FIG. 3B. Localized ridge set 395-D includes a ridge set including parallel ridges 391-D1 (separated by optional ridge isolation material), a ridge set including parallel ridges 391-D2 (separated by optional ridge isolation material), and planar (unridged) semiconductor surface regions 391-F1 and 391-F2. Conventional planar semiconductor devices (i.e., transistors, resistors, and/or capacitors) can be formed in these planar semiconductor surface regions 391-F1 and 391-F2 simultaneously with corrugated-semiconductor devices, e.g. by using the fabrication process flow described above. Note that while planar semiconductor surface regions 391-F1 and 391-F2 are depicted as covering roughly the same area as parallel ridges 391-D1 and 391-D2 for exemplary purposes, groupings of parallel ridges and planar regions can exhibit any relative sizing. Note further that a portion of a corrugated substrate can be considered a planar region so long as that portion provides an unridged area that is at least as wide as two ridges plus the spacing between those two ridges.

Ideally, a corrugated substrate will include sets of parallel ridges that cover an area at least as large as a basic functional block (e.g., a set of devices that performs a particular logic function). A corrugated substrate providing ridge sets sized in this manner can beneficially minimize the need for additional interconnect wiring between devices within functional blocks. Larger ridge sets can likewise minimize interconnect wiring requirements between functional blocks.

Figure 4A:
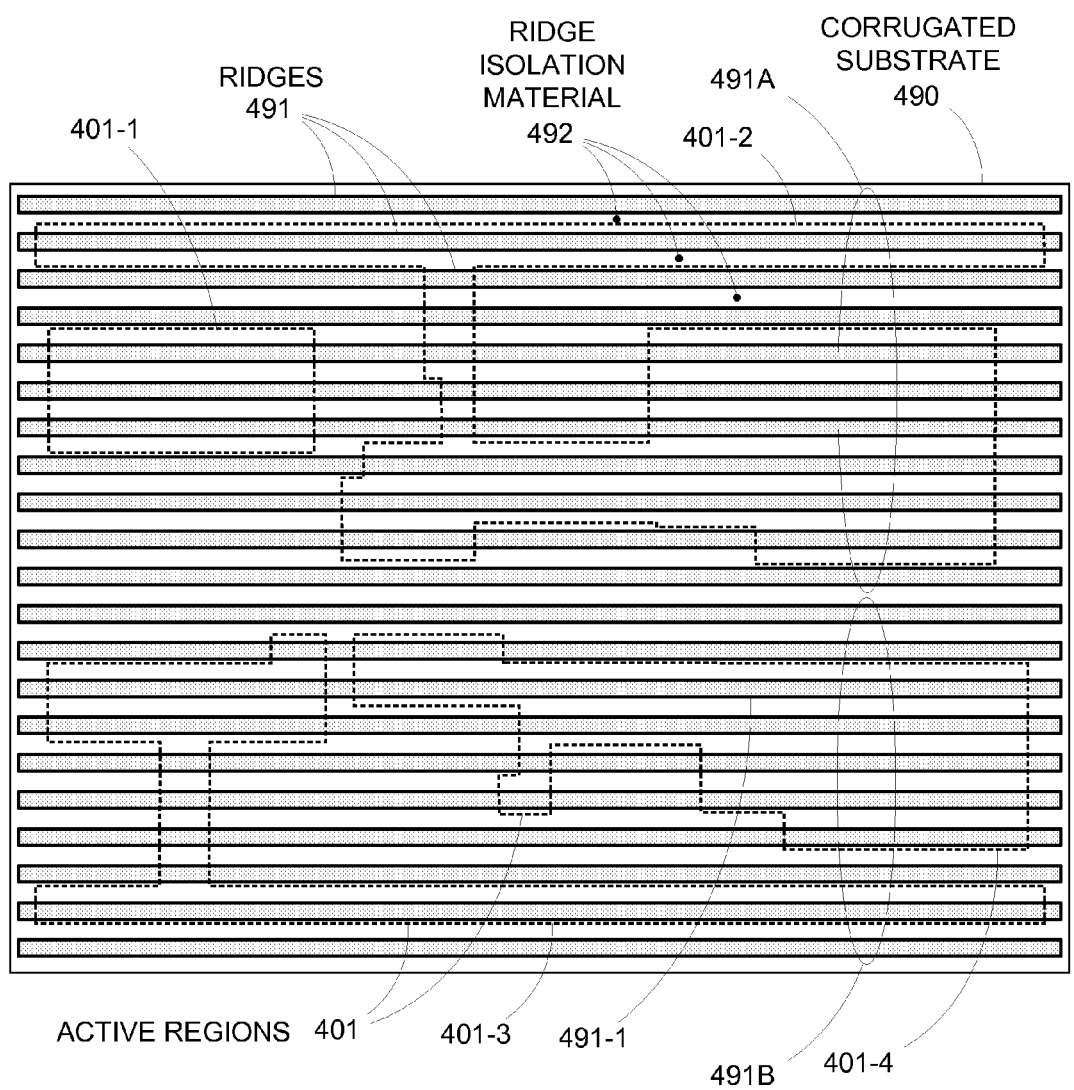
FIGS. 4A, 4B, 4C, 4D, and 4E are top views of an IC that incorporates transistors having segmented channel regions, at various steps in a manufacturing process.

For example, FIG. 4A shows a corrugated substrate 490 that includes a set of parallel ridges 491, optionally supplied with ridge isolation material 492 present between ridges 491 (alternatively, a dielectric formation operation can be performed to form ridge isolation material 492, in a manner substantially similar to that described with respect to FIG. 2B). Ridges 491 are substantially similar to ridges 191 described previously, and have a predetermined height (HR in FIG. 2A), width (WR in FIG. 2A), and composition (e.g., silicon, silicon germanium, silicon on silicon-germanium, or carbon nanotubes, among others). Active regions 401 (indicated by the dotted lines) represent locations where functional elements of a circuit are to be formed.

Note that while ridges 491 are dimensionally very similar, the composition of ridges 491 can vary. For example, a ridge group 491A could include a top silicon layer (e.g. a silicon ridge) providing (110) surface crystalline orientation, and a ridge group 491B could include a top silicon layer (e.g., an SOI ridge) providing (001) surface crystalline orientation. Then, if active regions 401-1 and 401-2 represent regions in which p-channel devices are to be formed, the ridges 491 in ridge group 491A provide a surface crystalline orientation optimized for p-channel transistor performance. Similarly, if active regions 401-3 and 401-4 represent regions in which n-channel devices are to be formed, the ridges 491 in ridge group 491B provide a surface crystalline orientation optimized for n-channel transistor performance.

Figure 4B:
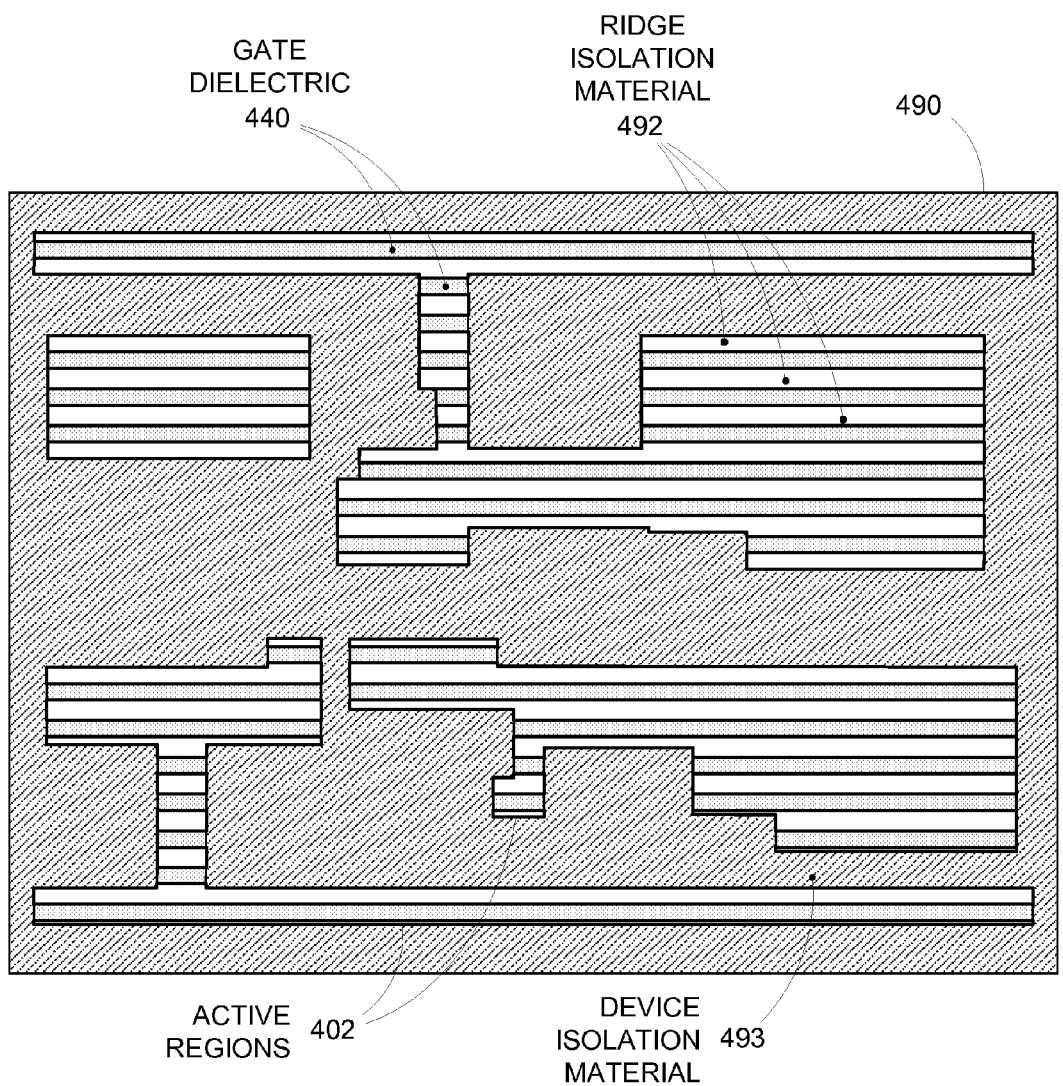

To begin the manufacturing process, the portions of ridges 491 (and all or part of ridge isolation material 492) that lie outside of the active regions 401 are removed (e.g., the portions of ridges 491 and insulation material 492 within active regions 401 could be masked, and the unmasked portions of ridges 491 and ridge isolation material 492 could then be etched away, as described with respect to FIG. 2C). Non-ridge portions of substrate 490 are then filled with device insulation material 493 (e.g., shallow trench isolation), as shown in FIG. 4B (e.g., as described with respect to FIG. 2D), and ridge isolation material 492 and device isolation material 493 can be optionally etched to expose the top portions of the remaining ridges 491 (e.g., as described with respect to FIG. 2E). Alternatively, ridges 191 can be optionally extended upwards by selective epitaxial growth. The exposed portions of ridges 491 are then covered with gate dielectric layer(s) 440 (as described with respect to FIG. 2F).

Figure 4C:
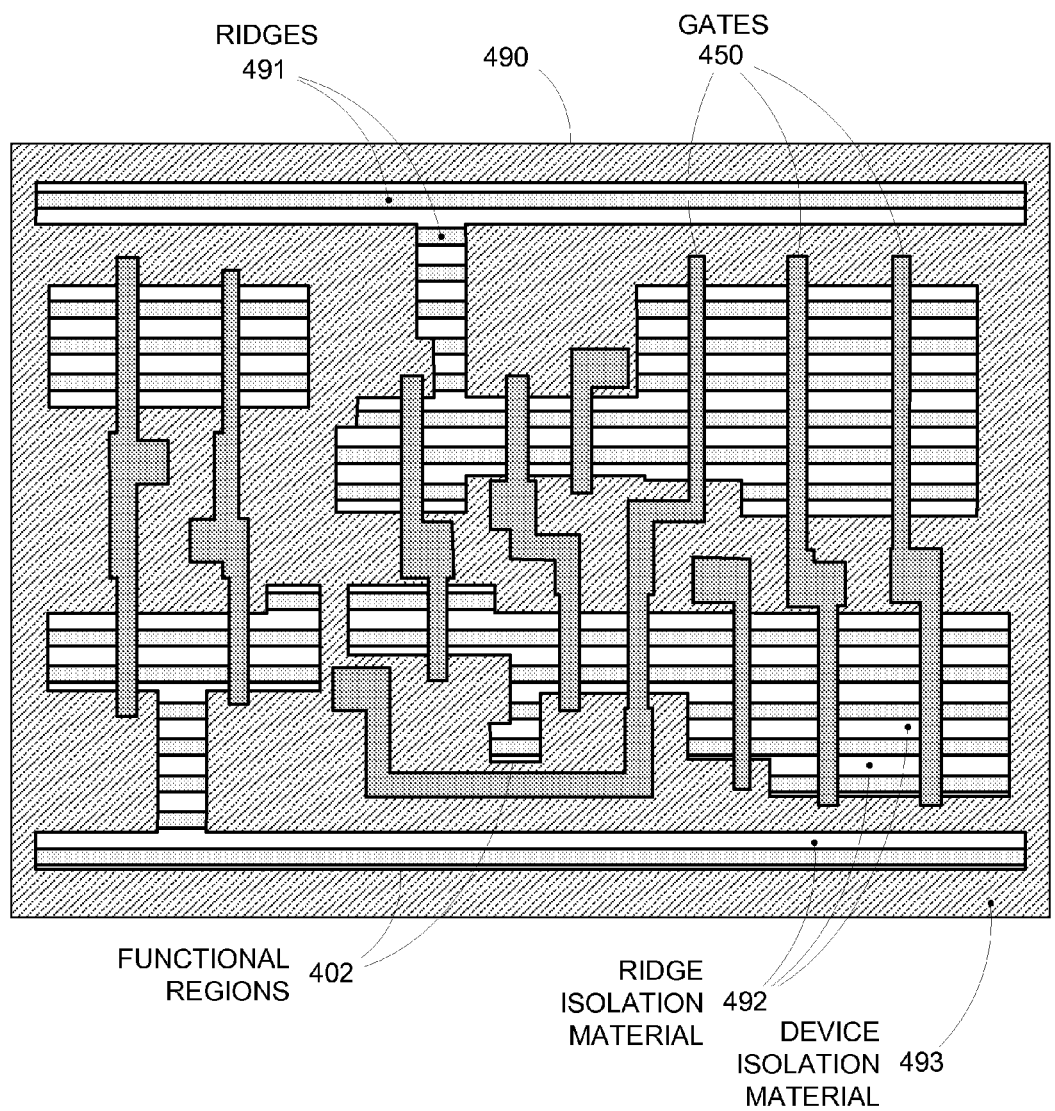
Figure 4D:
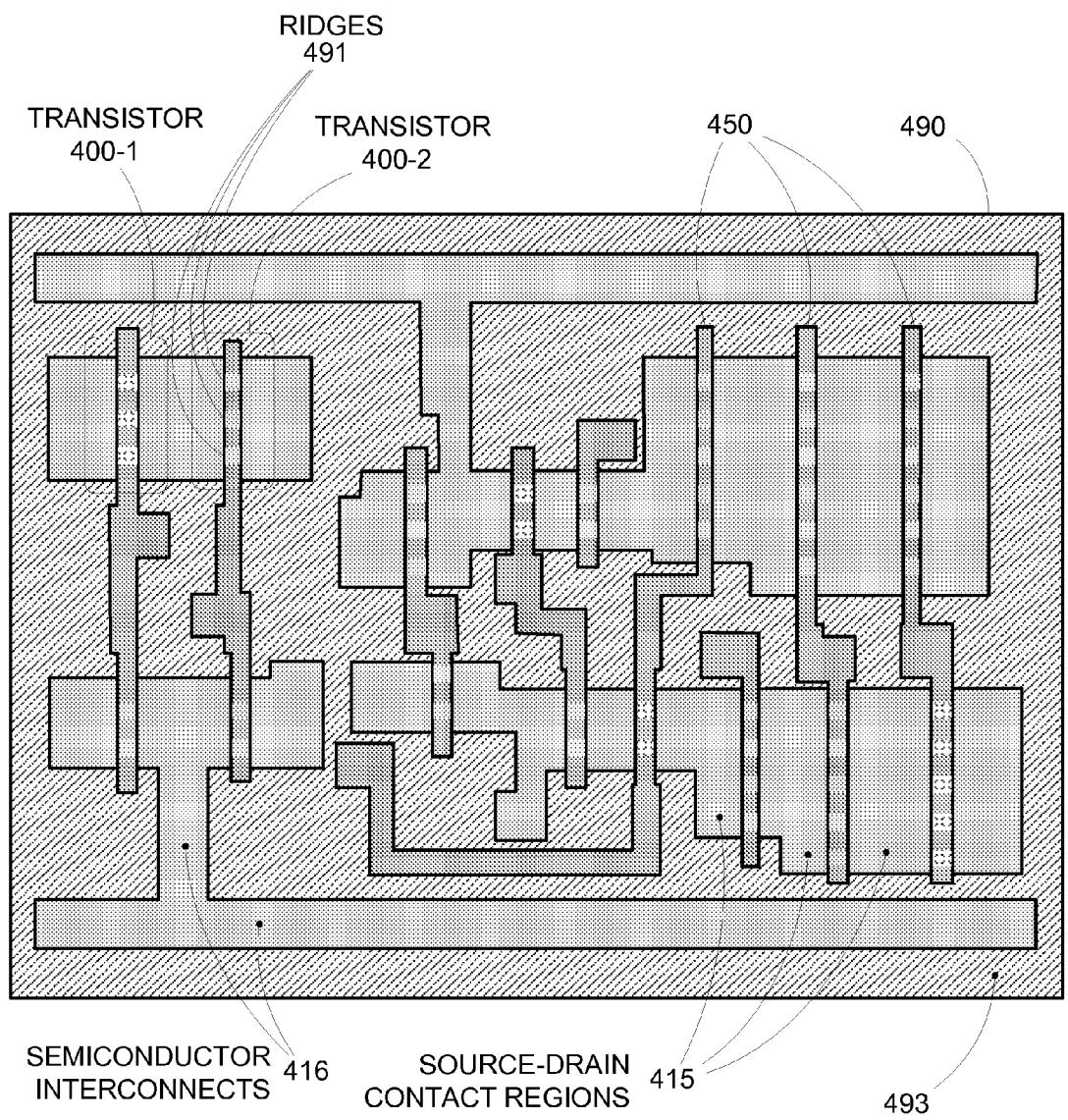

Next, in FIG. 4C, gates 450 are formed over desired transistor channel locations, as described with respect to FIG. 2G. At this point, an optional doping operation (e.g., ion implantation operation) can be performed to create source/drain extensions (e.g., 110-L and 130-L in FIG. 1C) within the ridges in the regions not covered by gates 450. Sidewall spacers (not shown for clarity) may then be formed along the sidewalls of gates 450 (e.g., as described with respect to FIG. 2H), after which another doping operation can be performed to form deeper source and drain regions (e.g., 110 and 130 in FIG. 1C). The portions of gate dielectric layers 440 that are not covered by gates 450 may then be removed (e.g., etched selectively off of ridges 491, as described with respect to FIG. 2I)). The exposed portions of ridges 491 can be filled-in with semiconductor material to form non-segmented source-drain contact regions 415 and semiconductor interconnects 416 with a continuous, substantially planar surface, as shown in FIG. 4D (e.g., as described with respect to FIG. 2J). The source-drain contact regions 415 can be doped in-situ during the deposition/growth of the semiconductor material, or they may be doped with a separate doping operation (e.g., a high-dose ion implantation operation), to complete the transistors in the circuit (e.g., transistors 400-1 and 400-2). Any desired well and/or channel doping (e.g., pulse-shaped doping) could be performed on ridges 491 at any time up to this point. Furthermore, any desired metal-semiconductor compound formation in source/drain extension regions (and/or source/drain regions) can be performed. For reference purposes, the portions of ridges 491 in the channel regions of the transistors are indicated by the lightly shaded rectangles in gates 450 in FIG. 4D. A metal-semiconductor compound (e.g., silicide, germanide, or germanosilicide) may be formed in source-drain contact regions 415 (as described with respect to FIG. 2K) to reduce contact resistance. Note that if the gate overlap distance HG (e.g., as shown in FIGS. 1B and 2E) for a given transistor(s) in FIG. 4D is greater than the ridge width W (e.g., as shown in FIGS. 1B and 2A) of that transistor, then that transistor would essentially be a FinFET. In any case, to complete the IC, standard passivation, contact formation, metallization, and post-metallization annealing (PMA) steps can then be performed to complete circuit 408 depicted in FIG. 4E (metallization not shown for clarity).

Note that if the exposed portions of ridges 491 are not filled-in with semiconductor material to form non-segmented source-drain contact regions 415 with a continuous, substantially planar surface, metal contacts to the source-drain regions can still be made using standard passivation, contact formation, and metallization steps. Methods specifically adapted for the formation of source/drain contacts for FinFETs can also be used, and may be preferable.

Note that if the depth D of source 110 and drain 130 extends below the base of ridge 191 (i.e. D is greater than HR as shown in FIG. 1C), the ridges in the source-drain contact regions 415 comprise a single doped region and hence are electrically connected, even if the exposed portions of ridges 491 are not filled-in with semiconductor material to form non-segmented source-drain contact regions 415 with a continuous, substantially planar surface. This is also the case for the semiconductor interconnects 416 which provide for device-level electrical connections.

As noted above, the source-drain contact regions 415 consisting of "filled" ridges 491 provide reliable landing locations for contacts 405 (although contacts could also be made to the original ridges 491 themselves). Furthermore, the semiconductor interconnects 416 formed in this manner provide device-level electrical connections with low sheet resistance. Consequently, the metallization requirements for circuit 408 are reduced, which can reduce cost and provide greater interconnect routing flexibility in the metal layer(s) of circuit 408. Note that in one embodiment, transistors formed along common ridges 191 (e.g., transistors 400-1 and 400-2), could include unfilled ridges 191 and yet have a device-level electrical connection between the transistors.

Note further that due to the use of a corrugated substrate (490) in the formation of circuit 408, the channel segments (ridges 491) in adjacent transistors will always be closely aligned. For example, each of the eight transistors running across the bottom of circuit 408 (formed at gates 450) includes a channel segment aligned along a centerline CL. Such an arrangement is inevitable, since each of those channel segments was originally part of a single ridge 491 (i.e., ridge 491-1 shown in FIG. 4A). Each channel segment along centerline CL can easily exhibit dimensional consistency and alignment accuracy within 5% from segment to segment (i.e., the widths and centerlines of the channel segments will all be within 5% of the widths and centerlines, respectively, of all the other channel segments). In contrast, a circuit manufactured using a conventional (non-corrugated) substrate will not exhibit the same degree of dimensional consistency and channel alignment, due to the lack of similar alignment constraints in the design and manufacturing process, and more importantly, due to inherently irregular patterns defined by optical lithography in IC manufacturing processes.

Figure 4E:
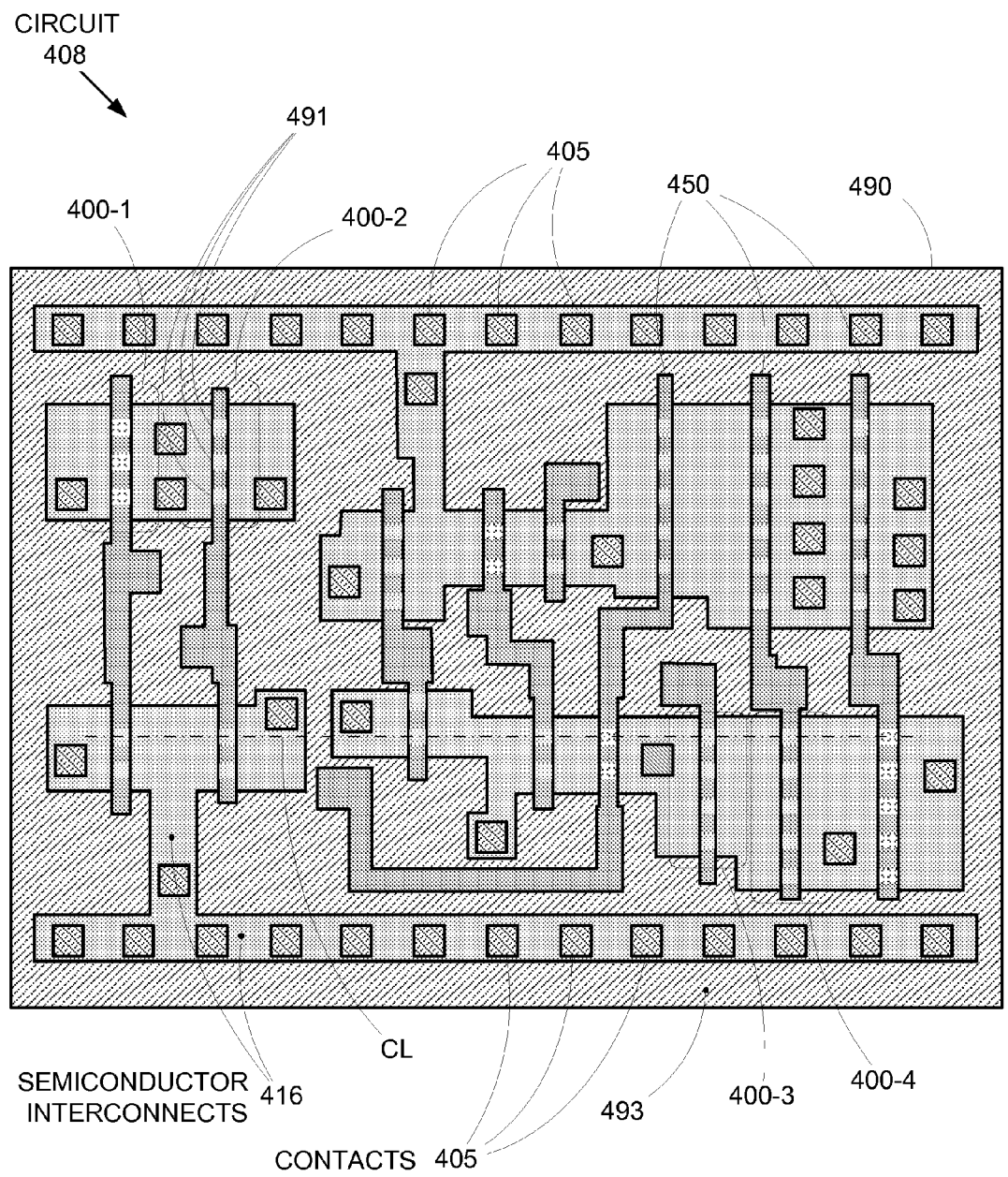
Figure 5:
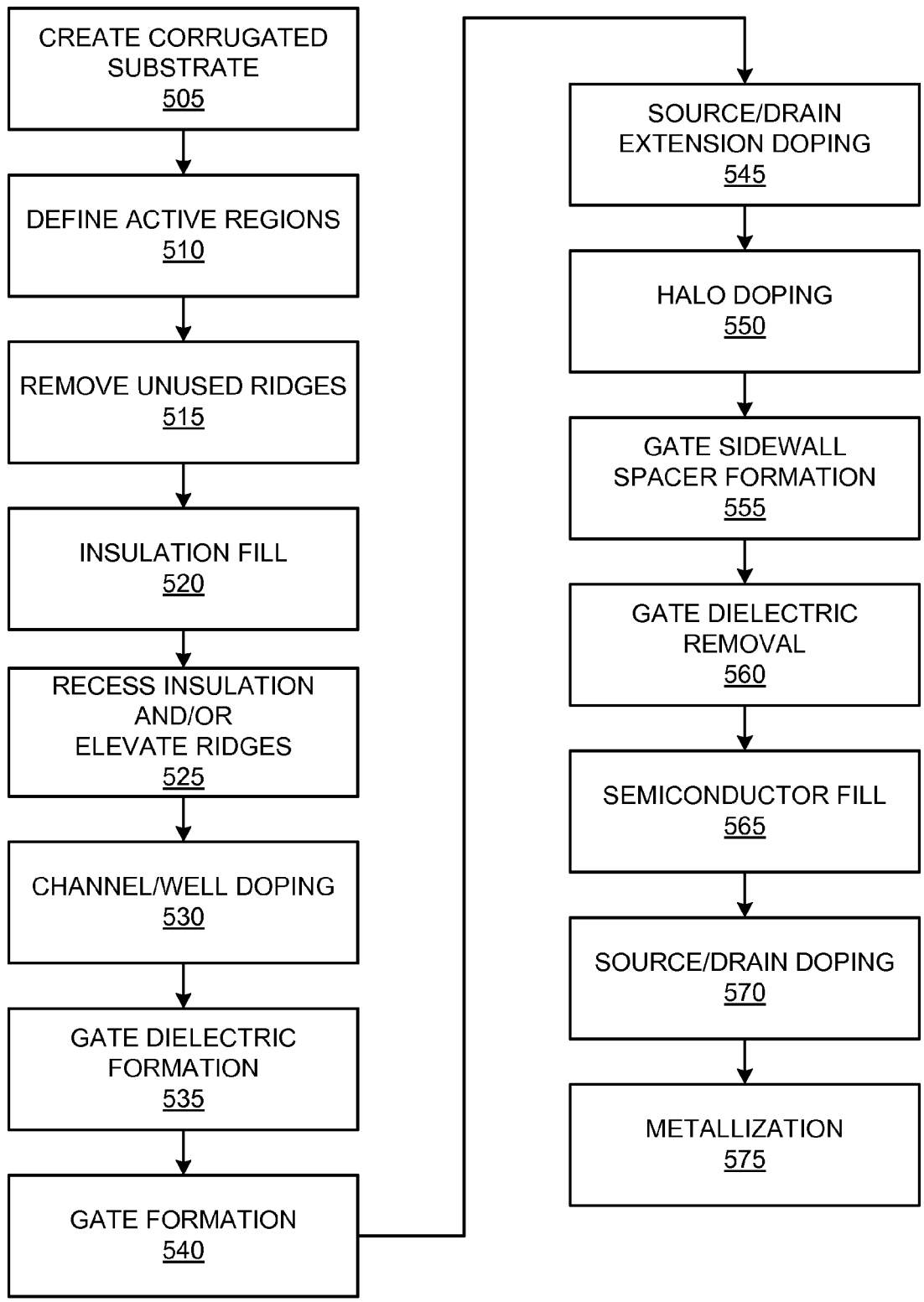
FIG. 5 is a flow diagram of a process for manufacturing an IC that incorporates transistors having segmented channel regions.

FIG. 5 shows a flow diagram of the manufacturing process described with respect to FIGS. 2A-2K and 4A-4E. First, in an optional "CREATE CORRUGATED SUBSTRATE" step 505, a corrugated substrate (e.g., 190 in FIG. 2A, 390-A in FIG. 3A, 390-B in FIG. 3B, and 490 in FIG. 4A) is formed using a high-precision manufacturing technique (e.g., double patterning, imprint lithography, or spacer lithography). Alternatively, a pre-made corrugated substrate can be used. Step 505 can also include a ridge isolation material formation operation (e.g., if isolation material is not included in the pre-made corrugated substrate).

Then, the active regions for the circuit (i.e., regions in which devices and optionally semiconductor interconnects are to be formed) are defined in a "DEFINE ACTIVE REGIONS" step 510 (as described with respect to FIGS. 2B and 4A). The ridges (and all or part of the ridge isolation material) outside of the active regions are then removed (e.g., etched away) in a "REMOVE UNUSED RIDGES" step 515 (as described with respect to FIGS. 2C and 4B), and device isolation material (e.g., device isolation material 493 in FIG. 4B) can be formed in the cleared field regions of the wafer in an optional "INSULATION FILL" step 520 (as described with respect to FIG. 2D). In one embodiment, the insulation layer can be formed over the ridges, and can subsequently be planarized down to the surface level of the ridges.

Top portions of the ridge isolation material and the device isolation material can then be removed in an optional "RECESS INSULATION" step 525 to expose top portions of the ridges (as described with respect to FIGS. 2E and 4B). Alternatively, the ridges can be extended upwards by selective epitaxial growth to expose top portions of the ridges. Optional well/channel doping (e.g., pulse-shaped doping) can be performed at this point in a "CHANNEL/WELL DOPING" step 530, or at any point before "METALLIZATION" step 575. The exposed portions of the ridges can then be coated with a gate dielectric layer in a "GATE DIELECTRIC FORMATION" step 535 (as described with respect to FIGS. 2F and 4B), and gates can be formed over the desired portions of the coated ridges in a "GATE FORMATION" step 540 (as described with respect to FIGS. 2G and 4C). If desired, source/drain extensions can be formed at this point in an optional "SOURCE/DRAIN EXTENSION DOPING" step 545 (as described with respect to FIGS. 2G and 4C). Optional halo or pocket doping can be performed at this point or prior to "SOURCE/DRAIN EXTENSION DOPING" step 545 in an optional "HALO DOPING" step 550 (e.g., as described with respect to FIGS. 1E and 1F). Sidewall spacers can be formed along the sidewalls of the gates in an optional "GATE SIDEWALL SPACER FORMATION" step 555 (as described with respect to FIGS. 2H and 4C). The unused portions of the gate dielectric layers (i.e., the portions not separating the gates from the ridges) can then be removed in an optional "GATE DIELECTRIC REMOVAL" step 560 (as described with respect to FIGS. 2I and 4C).

The spaces between the ridges can then be filled with semiconductor material in an optional "SEMICONDUCTOR FILL" step 565 and the source and drain regions for each of the transistors (i.e., the regions not covered by a gate) can then be doped in a "SOURCE/DRAIN DOPING" step 570 (as described with respect to FIGS. 2J and 4D). Note that in other embodiments, the source/drain doping performed in step 570 can be performed before the semiconductor fill operation of step 565. Note further that, as described with respect to FIGS. 2I and 2J, step 565 can involve etching down the ridges next to some or all of the gates and forming a different semiconductor material over the etched regions (either on individual ridges or as a blanket layer over all ridges) to induce a desired stress within the channel regions of the devices. Note further that in various embodiments, metal-semiconductor compound formation in source/drain extension regions (and/or source/drain regions) can be performed during step 570 (which can, in certain circumstances, eliminate the need for doping in the source/drain regions).

At this point, all or a portion of the gate stacks (each comprising a gate and gate dielectric layer) may be selectively removed and reformed. This may be advantageous for incorporating gate stack materials which cannot withstand significant thermal exposure.

Finally, any remaining operations for completing the circuit are performed in a "METALLIZATION" step 575 (e.g., source-drain contact region metal-semiconductor compound formation (e.g., silicidation, germanidation, or germanosilicidation), device passivation (including any additional stress engineering, such as forming stressed capping layers), contact formation, metallization, and PMA, as described with respect to FIGS. 2K and 4E).

The various embodiments of the structures and methods of this invention that are described above are illustrative only of the principles of this invention and are not intended to limit the scope of the invention to the particular embodiments described. Thus, the invention is limited only by the following claims and their equivalents.

What is claimed:

1. A transistor comprising:
    a source;
    a drain;
    a device isolation material disposed on at least one side of the transistor to a first depth in a substrate to isolate the transistor;
    a channel region extending from the source to the drain and comprising:
        a plurality of semiconductor ridges, each semiconductor ridge extending from the source to the drain and including at least a first layer of semiconductor material, and
        ridge isolation material disposed between the semiconductor ridges up to a recess height below exposed portions of the semiconductor ridges and extending from the source to the drain, the ridge isolation material extending into the substrate to a second depth not deeper than the first depth;
    a gate formed over the channel region; and
    a gate isolation material disposed between each semiconductor ridge and the gate.

2. The transistor of claim 1, wherein the first layer of semiconductor material is formed epitaxially.

3. The transistor of claim 2, wherein a thin silicon interfacial layer is disposed on the first layer of semiconductor material to form a multi layer region, the first layer comprising silicon-germanium.

4. The transistor of claim 1, wherein each semiconductor ridge includes a multi layer region comprising the first layer of semiconductor material, the multi layer region formed on a base region of each semiconductor ridge.

5. The transistor of claim 4, wherein the base region is narrower than the multi layer region.

6. The transistor of claim 1, wherein each semiconductor ridge includes a multi layer region comprising a plurality of silicon-germanium layers of increasing germanium concentration.

7. The transistor of claim 1, wherein the first layer of semiconductor material comprises silicon-germanium.

8. The transistor of claim 7, wherein each semiconductor ridge further includes a second layer of semiconductor material comprising germanium.

9. The transistor of claim 8, wherein each semiconductor ridge further includes a third layer of semiconductor material comprising gallium arsenide.

10. The transistor of claim 9, wherein each semiconductor ridge further includes a fourth layer of semiconductor material comprising aluminum-gallium-arsenide.

11. The transistor of claim 8, wherein each semiconductor ridge further includes a fifth layer of semiconductor material comprising indium-gallium-arsenide.

12. The transistor of claim 11, wherein each semiconductor ridge further includes a sixth layer of semiconductor material comprising indium-aluminum-arsenide.

13. The transistor of claim 11, wherein each semiconductor ridge further includes a seventh layer of semiconductor material comprising aluminum-gallium-arsenide.

14. The transistor of claim 1, wherein the ridge isolation material comprises a high-permittivity dielectric.

15. The transistor of claim 1, wherein a thin interfacial layer is disposed between the first layer of semiconductor material of the semiconductor ridges and the gate isolation material.

16. The transistor of claim 1, wherein the plurality of semiconductor ridges are formed on an elevated base region of the substrate.

17. The transistor of claim 16, wherein each of the plurality of semiconductor ridges has a ridge height above the elevated base region, and
wherein a height of the elevated base region above adjacent portions of the substrate is equal to at least the ridge height.

18. The transistor of claim 1, wherein the gate isolation material disposed between the gate and each of the plurality of semiconductor ridges is formed on an exposed portion of each semiconductor ridge.

19. A transistor comprising:
a source;
a drain;
a device isolation material disposed on at least one side of the transistor to a first depth in a substrate to isolate the transistor;
a channel region extending from the source to the drain and comprising:
a plurality of semiconductor ridges, each semiconductor ridge extending from the source to the drain and including an epitaxially grown layer on top of an elevated base region of the substrate, and
ridge isolation material disposed between the semiconductor ridges up to a recess height below exposed portions of the semiconductor ridges and extending from the source to the drain, the ridge isolation material extending into the substrate to a second depth not deeper than the first depth;
a gate formed over the channel region; and
a gate isolation material disposed between each semiconductor ridge and the gate.

20. The transistor of claim 19, wherein a base region of each semiconductor ridge comprises a heavily doped region having a greater dopant concentration than the epitaxial region.

21. The transistor of claim 19 wherein the epitaxial layer comprises a lightly doped region and heavily doped region.

22. The transistor of claim 21, wherein the lightly doped region wraps around the heavily doped region.

23. The transistor of claim 20, wherein the base region is narrower than the epitaxial region.

24. The transistor of claim 19, wherein the ridge isolation material comprises high-permittivity dielectric.

25. The transistor of claim 24, further comprising a thin interfacial layer between the ridge isolation material and the semiconductor ridges.

26. The transistor of claim 19, wherein the plurality of semiconductor ridges are formed on an elevated base region of the substrate.

27. The transistor of claim 26, wherein each of the plurality of semiconductor ridges has a ridge height above the elevated base region, and
wherein a height of the elevated base region above adjacent portions of the substrate is equal to at least the ridge height.

28. The transistor of claim 19, wherein the gate isolation material disposed between the gate and each of the plurality of semiconductor ridges is formed on an exposed portion of each semiconductor ridge.

29. The transistor of claim 1, wherein the gate isolation material disposed between each semiconductor ridge and the gate contacts three sides of the exposed portions of the semiconductor ridges.

30. The transistor of claim 4, wherein the base region of each semiconductor ridge comprises a heavily doped region having a greater dopant concentration than the multi layer region.

31. The transistor of claim 19, wherein the gate isolation material disposed between each semiconductor ridge and the gate contacts three sides of the exposed portions of the semiconductor ridges.

32. The transistor of claim 1, wherein the recess height is between 15 and 45 nanometers from a top of the exposed portions of the semiconductor ridges, the exposed portions of the semiconductor ridges extending above the ridge isolation material by the recess height.

33. The transistor of claim 19, wherein the recess height is between 15 and 45 nanometers from a top of the exposed portions of the semiconductor ridges, the exposed portions of the semiconductor ridges extending above the ridge isolation material by the recess height.

* * * * *